(12) United States Patent
Isler

(10) Patent No.: US 10,859,644 B2
(45) Date of Patent: Dec. 8, 2020

(54) MANUFACTURING OF HIGH PERFORMANCE MAGNETORESISTIVE SENSORS

(71) Applicant: NXP B.V., Eindhoven (NL)

(72) Inventor: Mark Isler, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/359,141

(22) Filed: Mar. 20, 2019

(65) Prior Publication Data

US 2020/0300940 A1  Sep. 24, 2020

(51) Int. Cl.
| | | |
|---|---|---|
| *G01R 33/09* | (2006.01) | |
| *H01F 10/32* | (2006.01) | |
| *H01F 41/34* | (2006.01) | |
| *H01L 27/22* | (2006.01) | |
| *H01L 43/12* | (2006.01) | |
| *H01L 43/10* | (2006.01) | |

(52) U.S. Cl.
CPC ......... *G01R 33/093* (2013.01); *G01R 33/096* (2013.01); *G01R 33/098* (2013.01); *H01F 10/3254* (2013.01); *H01F 41/34* (2013.01); *H01L 27/22* (2013.01); *H01L 43/12* (2013.01); *H01L 43/10* (2013.01)

(58) Field of Classification Search
CPC .. G01R 33/093; G01R 33/096; G01R 33/098; H01L 43/12; H01L 27/22; H01L 43/10; H01F 41/34; H01F 10/3254
See application file for complete search history.

(56) References Cited

U.S. PATENT DOCUMENTS

| | | | |
|---|---|---|---|
| 4,838,994 A | 6/1989 | Gulde et al. | |
| 5,904,566 A * | 5/1999 | Tao ................... | H01L 21/31116 257/E21.252 |
| 10,069,064 B1 * | 9/2018 | Haq ...................... | H01L 27/222 |
| 2004/0084400 A1 | 5/2004 | Costrini et al. | |
| 2006/0148234 A1 | 7/2006 | Chen et al. | |
| 2007/0119811 A1 | 5/2007 | Nakatani et al. | |
| 2011/0048628 A1 * | 3/2011 | Sato ....................... | G11B 5/855 156/250 |

(Continued)

FOREIGN PATENT DOCUMENTS

| | | |
|---|---|---|
| EP | 3432374 A1 | 1/2019 |
| WO | WO-2012/015465 A1 | 2/2012 |

*Primary Examiner* — Marcos D. Pizarro
*Assistant Examiner* — Sue Tang
(74) *Attorney, Agent, or Firm* — Charlene R. Jacobsen

(57) ABSTRACT

A method includes depositing a hardmask layer over a magnetoresistive (MR) structural layer formed on a substrate, the hardmask layer being formed from tungsten or a tungsten-based composition. A photoresist layer is deposited over the hardmask layer and is patterned to expose a first portion of the hardmask layer. A first etch process is performed to remove the first portion of the hardmask layer and expose a second portion of the MR structural layer and a dry etch process is performed to remove the second portion of the MR structural layer and produce an MR sensor structure. Following the dry etch process, a composite structure remains that includes the MR sensor structure and a hardmask section of the hardmask layer, the hardmask section overlying the MR sensor structure. A spacer formed from a protective, dielectric material layer may additionally be formed surrounding the composite structure.

13 Claims, 13 Drawing Sheets

(56) References Cited

U.S. PATENT DOCUMENTS

| | | | |
|---|---|---|---|
| 2011/0309050 A1* | 12/2011 | Iori | H05H 1/46 |
| | | | 216/67 |
| 2014/0308758 A1 | 10/2014 | Nemani et al. | |
| 2014/0315329 A1* | 10/2014 | Deshpande | G11B 5/84 |
| | | | 438/3 |
| 2015/0255507 A1 | 9/2015 | Pakala et al. | |
| 2019/0025086 A1 | 1/2019 | Lee et al. | |

* cited by examiner

PRIOR ART

PRIOR ART

PRIOR ART

MANUFACTURING OF HIGH PERFORMANCE MAGNETORESISTIVE SENSORS

TECHNICAL FIELD OF THE INVENTION

The present invention relates generally to magnetic field sensors. More specifically, the present invention relates to robust manufacturing of high performance magnetoresistive sensors.

BACKGROUND OF THE INVENTION

Magnetic field sensor systems are utilized in a variety of commercial, industrial, and automotive applications to measure magnetic fields for purposes of speed and direction sensing, angular sensing, proximity sensing, and the like. Magnetic field sensors may be based on semiconductor materials (e.g., Hall sensors, magnetoresistors, and so forth) and ferromagnetic materials (e.g., ferromagnetic magnetoresistors and flux guides).

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, the present disclosure concerns magnetic field sensors and robust manufacturing of high performance magnetoresistive (MR) sensors. More particularly, manufacturing methodology entails precision patterning of the magnetic layer(s) using a dry etching technique while concurrently reducing manufacturing defects, cross contamination of manufacturing tools, and manufacturing costs. The disclosed methodology can enable a high yield wafer fabrication process for manufacturing high performance AMR (anisotropic magnetoresistance), GMR (giant magnetoresistance), TMR (tunnel magnetoresistance) sensors, and the like. The precision etching of the magnetic layers(s) can enable the manufacture of dense MR structures of small magnetic area that may be incorporated into sensor systems having several full and half bridge architectures. In this way, the manufacturing of MR sensors that are largely immune to high magnetic perturbation fields may be achieved, e.g., by using a gradient technique.

The instant disclosure is provided to further explain in an enabling fashion at least one embodiment in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Figure 1:
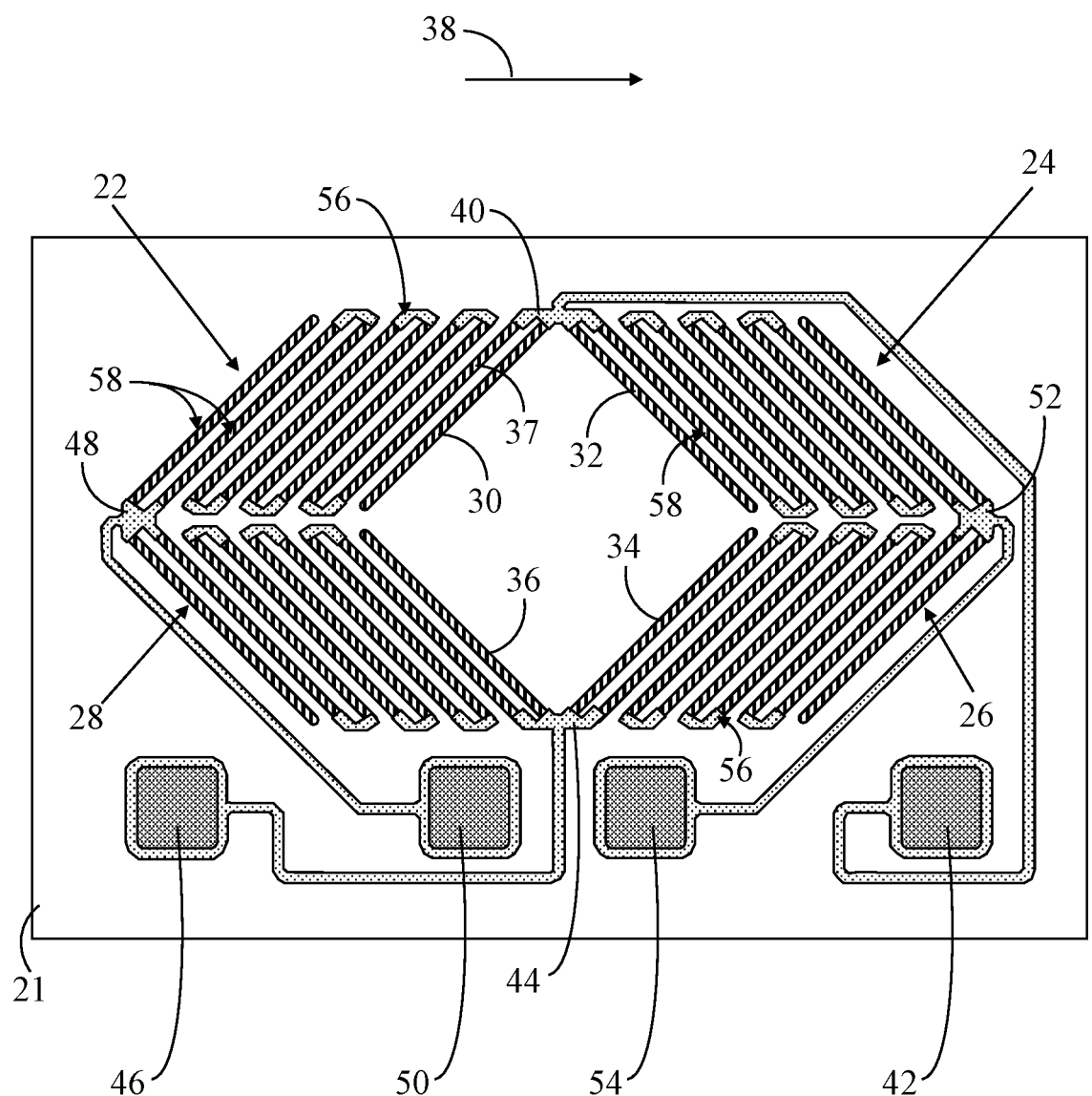
FIG. 1 shows, in a simplified and representative form, a top view of a magnetic field sensor.

FIG. 1 shows, in a simplified and representative form, a top view of a magnetic field sensor 20 formed on a substrate 21. In this example, magnetic field sensor 20 includes a sensor bridge, and more particularly a Wheatstone bridge configuration having multiple sensor legs 22, 24, 26, 28. Each sensor leg 22, 24, 26, 28 includes anisotropic magnetoresistive (AMR) sensor structures 30, 32, 34, 36 capable of changing the value of their electrical resistance in response to an externally-applied magnetic field 38. Each of MR sensor structures 30, 32, 34, 36 may include multiple magnetoresistive fingers or stripes 37 connected in a serpentine fashion to maximize sensitivity and minimize sensor footprint. It should be understood that MR sensor structures 30, 32, 34, 46 may include any number of stripes 37 of magnetoresistive material connected in the serpentine arrangement. Further, alternative configurations of sensor elements that make up magnetic field sensor 20 may be implemented as MR sensor structures 30, 32, 34, 36.

In this example, each of stripes 37 of MR sensor structures 30, 32, 34, 36 includes a magnetic layer in the form of, for example, nickel-iron (NiFe) stripes. A suitable orientation of NiFe stripes 37 may enable maximum sensitivity of MR sensor structures 30, 32, 34, 36 to external magnetic field 38 and/or linearization of sensor characteristics, particularly for speed sensors with respect to the sensitive magnetic field direction. Although AMR sense elements are mentioned herein, alternative embodiments may include tunnel magnetoresistance (TMR) sense elements, giant magnetoresistance (GMR) sense elements, and so forth capable of detecting a magnetic field.

Sensor legs 22, 28 are coupled in series to form a first half of the Wheatstone sensor bridge and sensor legs 24, 26 are coupled in series to form a second half of the Wheatstone sensor bridge. A junction 40 of sensor legs 22, 24 is electrically connected to a first input terminal, e.g., a first bond pad 42. A junction 44 of sensor legs 26, 28 is electrically connected to a second input terminal, e.g., a second bond pad 46. A junction 48 between sensor legs 22, 28 is electrically connected to a first output terminal, e.g. a third bond pad 50, and a junction 52 of sensor legs 24, 26 is electrically connected to a second output terminal, e.g., a fourth bond pad 54. Electrically conductive contact material forming junctions 40, 44, 48, 52, and electrically conductive traces coupled to first, second, third, and fourth bond pads 42, 46, 40, 52 are represented in FIG. 1 and in subsequent figures by a light stippled pattern.

It can additionally be observed that the electrically conductive contact material (represented by the light stippled pattern) also interconnects NiFe stripes 37 in the generally serpentine configuration. These regions at which the contact material electrically interconnects stripes 37 are referred to herein as contact areas 56. Conversely, the regions at which the contact material is not present such that NiFe stripes 37 are exposed from the contact material, are referred to therein as non-contact areas 58.

As is known to those skilled in the art, MR sensor structures 30, 32, 34, 36 are configured to detect externally-applied magnetic field 38 by changing the value of their electrical resistance in response to external magnetic field 38. The Wheatstone bridge configuration of magnetic field sensor produces a voltage output, $V_{OUT}$, between the output terminals, e.g., third and fourth bond pads 50, 54, in which the voltage output changes in response to the changing resistance in sensor legs 22, 24, 26, 28, as follows:

$$V_{OUT} = \left[ \frac{R_{22}}{(R_{22} + R_{24})} - \frac{R_{28}}{(R_{26} + R_{28})} \right] V_{IN} \quad (1)$$

In equation (1), $V_{IN}$ represents a voltage input between the input terminals, e.g., first and second bond pads 42, 46. The nomenclature, $R_{nn}$, represents the resistance at sensor legs 22, 24, 26, 28 in which the subscript "nn" indicates a particular sensor leg 22, 24, 26, 28.

For high performance magnetoresistive sensors (e.g., AMR, GMR, TMR) with high accuracy, low offset voltage, and immunity to high magnetic perturbation fields, the magnetic layer needs to be precisely patterned to form MR sensor structures (e.g., NiFe stripes 37 in this example). FIGS. 2-11 demonstrate prior art processing techniques and defects that may occur in response to these processing techniques. In accordance with embodiments discussed in detail herein, subsequent FIGS. 12-30 demonstrate methodology for fabricating magnetoresistive sensors (e.g., magnetic field sensor 20), that can reduce the potential for fabrication defects and enable the manufacture of high performance magnetoresistive sensors having dense MR sensor structures and small magnetic area.

Figure 2:
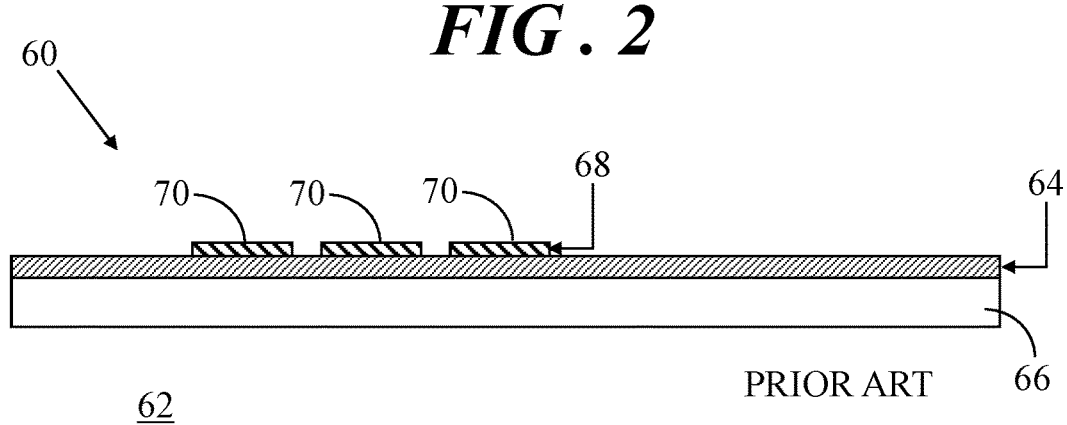
FIG. 2 shows a partial side view of a structure at an initial stage of magnetoresistive (MR) sensor fabrication in accordance with prior art methodology.

Referring now to FIG. 2, FIG. 2 shows a partial side view of a structure 60 at an initial stage 62 of magnetoresistive (MR) sensor fabrication in accordance with prior art methodology. In this example, a dielectric layer 64 (e.g., an oxide or nitride) may be deposited or thermally grown on a silicon substrate 66. Alternatively, dielectric layers may be formed on a complimentary metal-oxide-semiconductor (CMOS) substrate (not shown) containing an application specific integrated circuit (ASIC). Methodology further entails deposition of a magnetoresistive structural layer 68 (e.g., a NiFe composition), deposition and structuring of a photoresist material (not shown), wet etching of magnetoresistive structural layer 68 to form MR sensor structures 70 and stripping the photoresist material.

Figure 3:
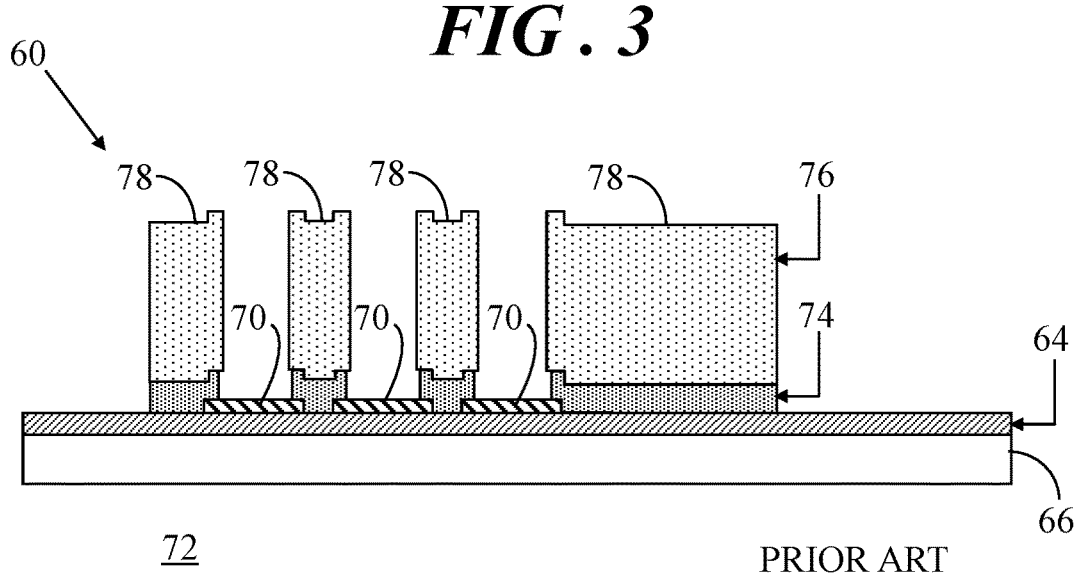
FIG. 3 shows a partial side view of the structure of FIG. 2 at a subsequent stage of fabrication.

FIG. 3 shows a partial side view of structure 60 of FIG. 2 at a subsequent stage 72 of fabrication. In this example, a barrier layer 74 may be deposited over MR sensor structures 70 and over exposed portions of dielectric layer 64 and a contact layer 76 may thereafter be deposited over barrier layer 74. In some architectures, barrier layer 74 may be a titanium-tungsten (TiW) composition and contact layer 76 may be an aluminum-copper composition. Barrier layer 74 separates MR sensor structures 70 from contact layer 76. In the absence of barrier layer 74, aluminum from contact layer 76 may diffuse into MR sensor structures 70 during thermal treatment. The aluminum could, therefore, contaminate MR sensor structures 70 which may degrade sensor performance.

Methodology further entails deposition and structuring of a photoresist material (not shown), etching contact layer 76 by, for example, a reactive ion etch (RIE) process to form electrical contacts 78 between various features of a MR sensor structure (e.g., between MR sensor structures 70, to bond pads, and so forth). Thereafter, the photoresist may be stripped, and barrier layer 74 is selectively removed using a wet etch process, with the remaining contact material (e.g., electrical contacts) serving as a hardmask.

Figure 4:
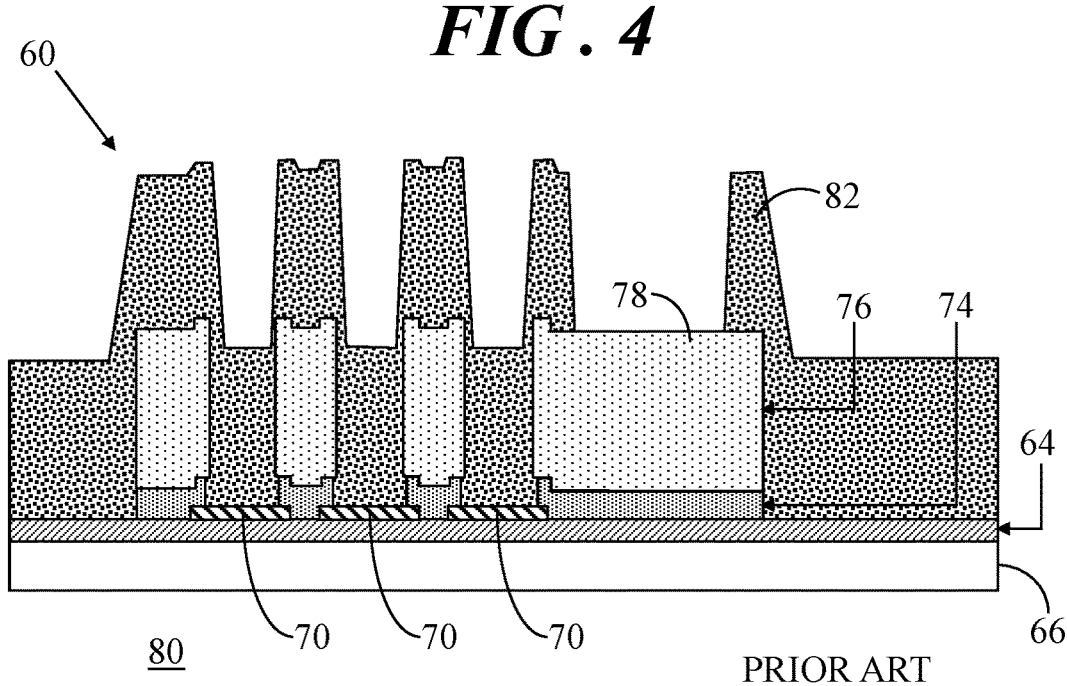
FIG. 4 shows a partial side view of the structure of FIG. 3 at a subsequent stage of fabrication.

FIG. 4 shows a partial side view of structure 60 of FIG. 3 at a subsequent stage 80 of fabrication. Methodology further entails deposition of a passivation layer 82, deposition and structuring of a photoresist (not shown), etching of passivation layer to suitably expose the electrical contacts 78 that may be used to form the bond pads, and stripping the remaining photoresist. In some instances, MR sensor structures 70 may thereafter by annealed.

The prior art methodology demonstrated in FIGS. 2-4, includes wet etching of magnetoresistive structural layer 68 to form MR sensor structures 70. Wet etching involves the use of liquid chemicals or etchants to remove a material layer. A critical dimension (CD) in etching is typically defined as the smallest feature that can be etched using a given process. Unfortunately, wet etching can yield relatively poor critical dimension control. In particular, CD control may be limited in wet etching by the ability of the reactant to reach the surface within a relatively thick photoresist mask opening or by the amount of undercut. Poor critical dimension control is particularly problematic for smaller and densely located MR sensor structures. Accordingly, attempts have been made to replace the wet etch process with a dry etch process to yield improvements in critical dimension control. In dry etching, ions of etchant or inert gases are used to remove a material layer.

Figure 5:
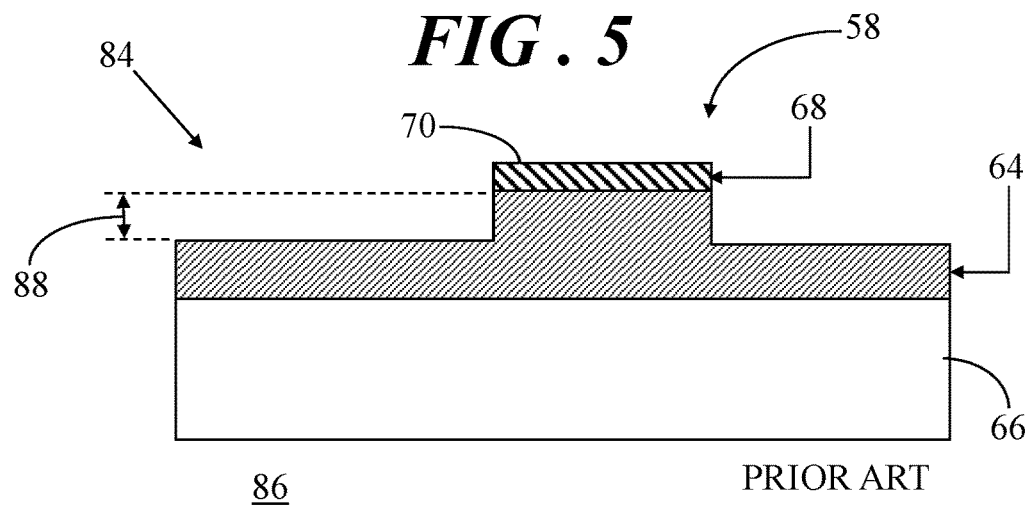
FIG. 5 shows a partial side view of another structure at an initial stage of magnetoresistive (MR) sensor fabrication.

Referring now to FIG. 5, FIG. 5 shows a partial side view of another structure 84 in non-contact area 58 at an intermediate stage 86 of magnetoresistive (MR) sensor fabrication. In this example, dielectric layer 64 has been deposited or thermally grown on silicon substrate 66, MR structural layer 68 (e.g., a NiFe composition) has been deposited on dielectric layer 64, and the photoresist material (not shown) has been deposited on MR structural layer 68 and suitably structured. Thereafter, MR structural layer 68 undergoes a dry etch process (such as, ion beam etching or ion milling) to form MR sensor structures 70 (one shown). A primary problem of non-reactive dry etching (such as, ion beam etching or ion milling) is possible re-deposition of the sputter-etched material at topography edges. That is, in the case of a small incident angle of an ion beam (i.e., a beam angle that is close to or approximately 90° perpendicular to the surface of MR structural layer 68), re-deposition of metallic particles can occur at sidewalls of the MR sensor structures 70. Re-deposition of the sputter-etched material may be reduced by directing the ion beam at a high incident beam angle (i.e., a beam angle that is significantly less than 90°, for example, approximately 30-60°) to clear the patterned structures from residues. However, a dry etch process is non-selective. A poorly selective or non-selective etch process will remove the top layer (magnetoresistive structural layer 68, in this example), but the etch process will also attack the underlying material (dielectric layer 64, in this example). As a consequence, directing the ion beam at a high incident angle can result in an over etch condition in which a step 88 is generated in the underlying dielectric layer 64, or even an under etch condition may occur.

Figure 6:
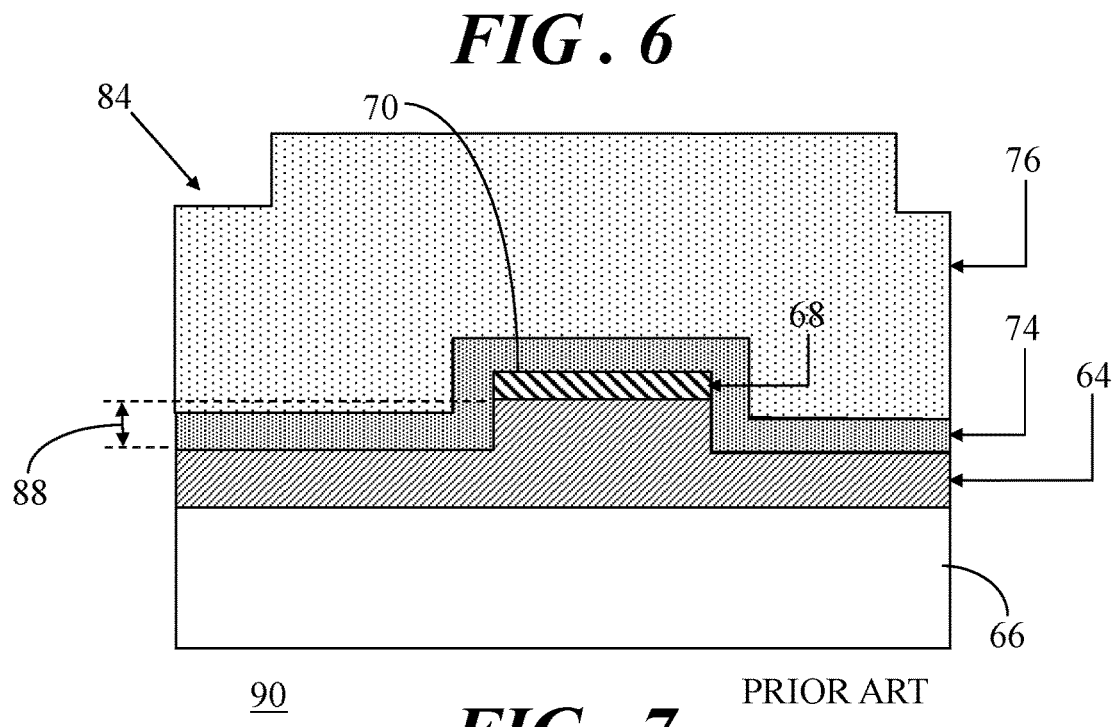
FIG. 6 shows a partial side view of the structure of FIG. 5 at a subsequent stage of magnetoresistive (MR) sensor fabrication.

FIG. 6 shows a partial side view of structure 84 of FIG. 5 at a subsequent stage 90 of magnetoresistive (MR) sensor fabrication. In this example, barrier layer 74 has been deposited over MR sensor structure 70 and over exposed portions of dielectric layer 64. Additionally, contact layer 76 has been deposited over barrier layer 74.

Figure 7:
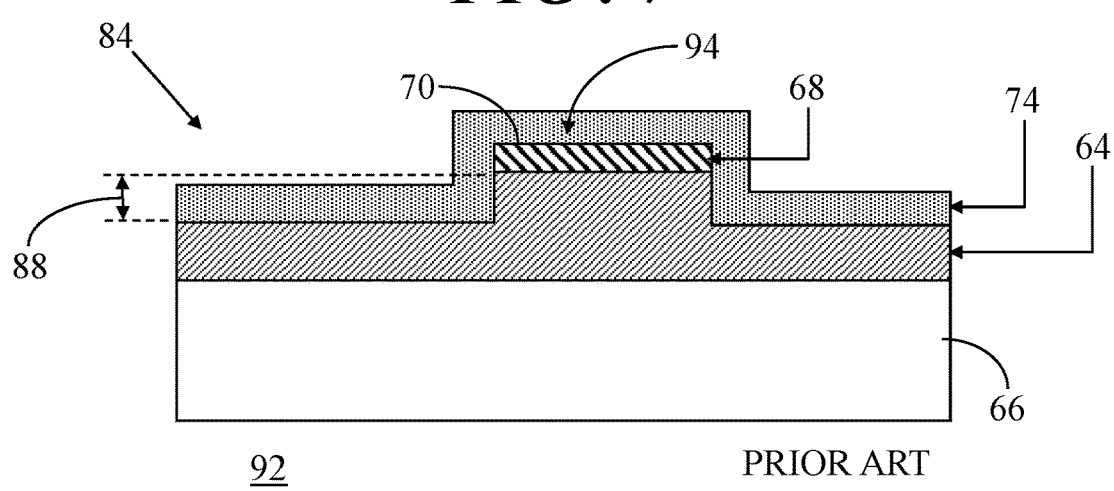
FIG. 7 shows a partial side view of the structure of FIG. 6 at a subsequent stage of magnetoresistive (MR) sensor fabrication.

FIG. 7 shows a partial side view of structure 84 of FIG. 6 at a subsequent stage 92 of magnetoresistive (MR) sensor fabrication. Again, methodology further entails deposition and structuring of a photoresist material (not shown), etching contact layer 76 by, for example, a reactive ion etch (RIE) process with the etch stop in barrier layer 74. Thereafter, the photoresist may be stripped. At stage 92, a non-contact area 94 of structure 84 is shown. In order to enable current to flow through MR sensor structures 70, this barrier layer 74 must be removed at non-contact areas 94. Accordingly, barrier layer 74 may be selectively removed at non-contact area(s) 94 using a wet etch process, with the remaining contact material 76 (e.g., electrical contacts) serving as a hardmask.

Figure 8:
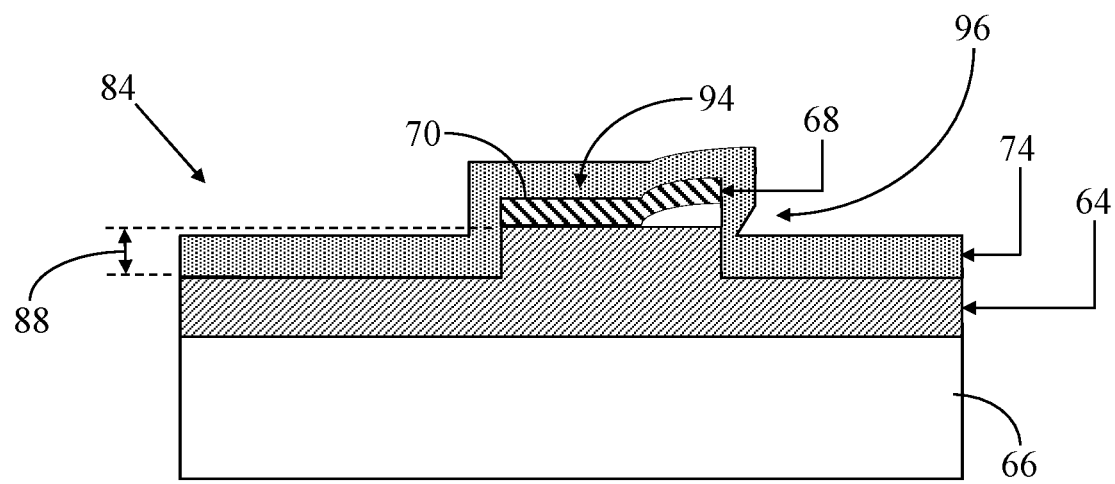
FIG. 8 shows a partial side view of the structure of FIG. 7 exhibiting a manufacturing defect resulting from prior art magnetoresistive (MR) sensor fabrication methodology.
Figure 9:
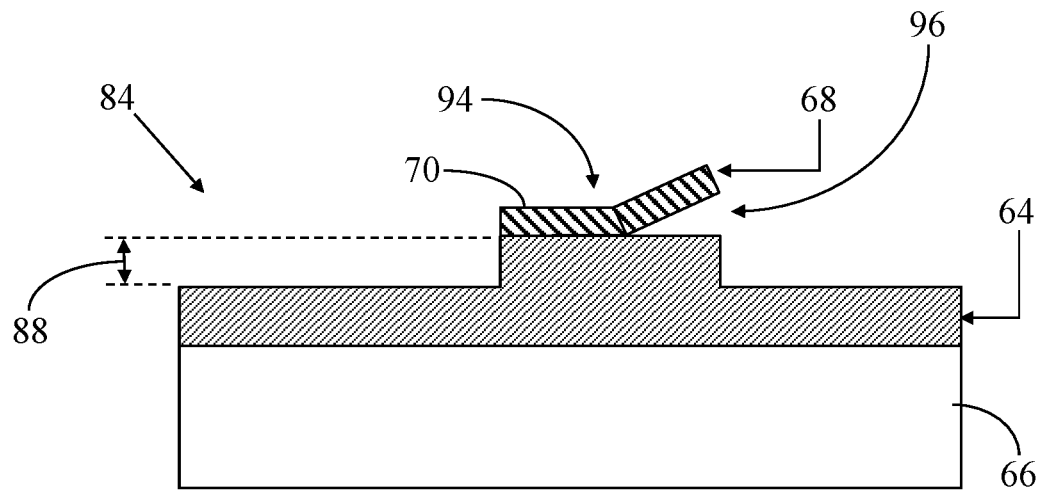
FIG. 9 shows another partial side view of the structure of FIG. 8 at a subsequent stage of processing.

Referring to FIGS. 8 and 9, FIG. 8 shows a partial side view of structure 84 of FIG. 7 exhibiting a manufacturing defect 96 resulting from prior art magnetoresistive (MR) sensor fabrication methodology and FIG. 9 shows another partial side view of structure 84 of FIG. 8 following removal of barrier layer 74. It has been observed that MR structural layer 68 may lift off or peel away from the underlying dielectric layer 64 due to the stress resulting from the height of step 88 or under etch caused by dry etching MR structural layer 68 to form MR sensor structures 70, a compressive stress of barrier layer 74, and thermal expansion of metals at elevated temperatures (for example, when the photoresist is stripped) after dry etching of contact layer 76. This leads to defectivity issues, yield loss, potential cross-contamination of tools, and high manufacturing costs.

The primary reason that peeling occurs at the edge of NiFe MR sensor structures 70 is the stress distribution generated by barrier layer 74. This stress distribution depends on the geometrical factors of the thickness of barrier layer 74, the thickness of NiFe MR sensor structures 70, and the height of step 88 generated by ion beam etching of MR structural layer 68. For low aspect ratios (e.g., thickness of barrier layer 74 divided by a summation of the thickness of MR structural layer 68 and the height of step 88), the compressive stress along the wafer surface is considerably reduced at the edge of MR sensor structures 70 and a tensile stress region may additionally be formed. This condition reduces the interfacial adhesion energy which can lead to peeling of MR sensor structures 70 from the underlying dielectric layer 64.

This peeling issue can also be related to the relatively poor adhesion of MR sensor structures 70 (formed from a NiFe composition) to the underlying dielectric layer 64 in contrast to a titanium- or tantalum-containing barrier layer 74 which has significantly better adhesion to NiFe MR sensor structures 70. Some prior art techniques utilize an adhesion layer (e.g., tantalum or tantalum-nitride composition) below MR structural layer 68 to avoid lift-off or peeling of NiFe MR sensor structures 70 from the underlying dielectric layer 64. A drawback of this approach, however, is generation of a dead magnetic layer at the NiFe/tantalum interface, parasitic parallel conduction, and tantalum interdiffusion into the NiFe which leads to considerable performance degradation of the resulting MR sensors.

Figure 10:
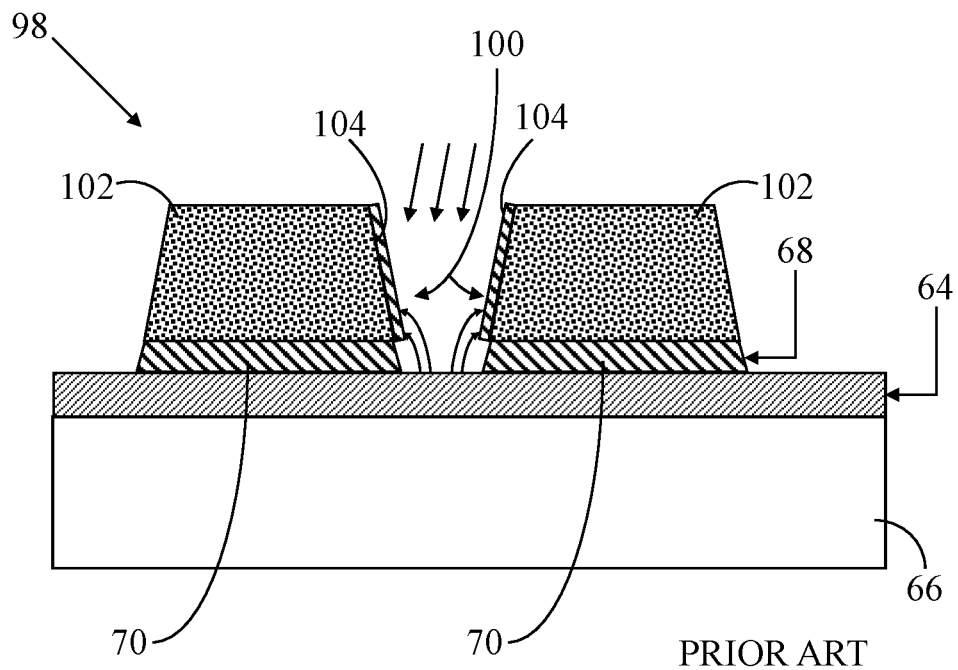
FIG. 10 shows a partial side view of another structure exhibiting a manufacturing defect resulting from prior art magnetoresistive (MR) sensor fabrication methodology.
Figure 11:
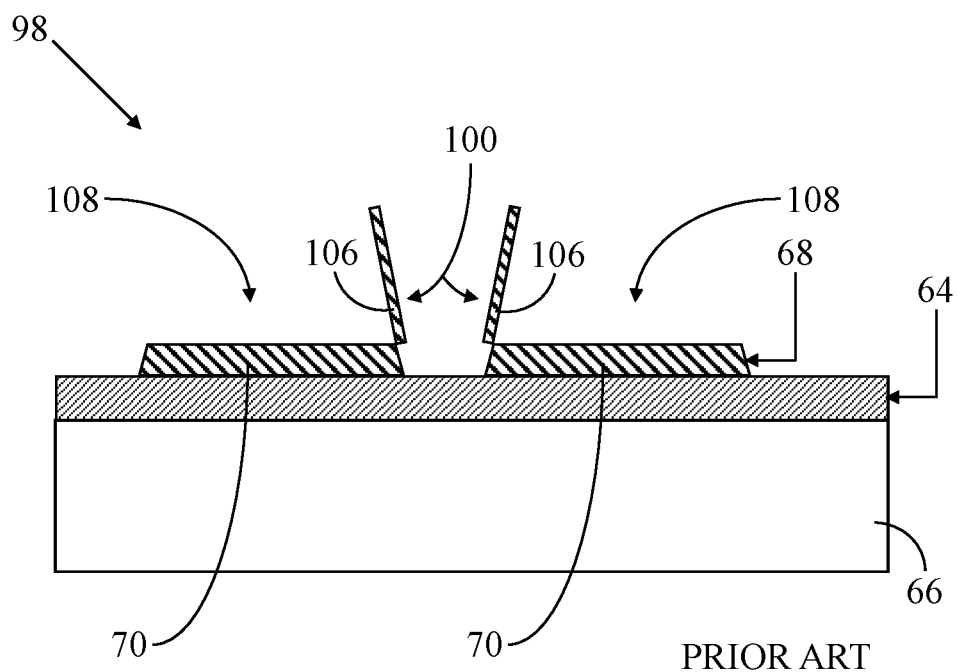
FIG. 11 shows another partial side view of the structure of FIG. 10 at a subsequent stage of processing.

Referring to FIGS. 10 and 11, FIG. 10 shows a partial side view of another structure 98 exhibiting a manufacturing defect 100 resulting from prior art magnetoresistive (MR) sensor fabrication methodology and FIG. 11 shows another partial side view of the structure of FIG. 10 following removal of a photoresist mask 102. In this example, manufacturing defect 100 entails the re-deposition of MR structural layer 68 at sidewalls 104 of photoresist mask 102 during a non-reactive dry etch process. Following removal of photoresist mask 102, fences 106.

As mentioned above, a low aspect ratio (e.g., thickness of barrier layer 74 divided by a summation of the thickness of MR structural layer 68 and the height of step 88) can result in peeling at the edge of NiFe MR sensor structures 70. The aspect ratio may be increased by increasing the thickness of barrier layer 74. However, this may not be a practical solution since stress typically increases with increasing thickness of barrier layer 74 (e.g., TiW film thickness). The thickness of NiFe MR structural layer 68 is determined and given by the sensor performance, and therefore cannot be changed to increase the aspect ratio. Accordingly, one approach may be to reduce the height of step 88 in order to increase the aspect ratio. Reduction of the height of step 88 or reducing the under etch may be achieved by reducing the etch time. However, reducing the etch time to a level suitable for reducing the height of step 88 may result in uncleared re-deposition of the MR structural layer 68 at sidewalls 104 of photoresist mask 102, and fences 106 remaining following removal of photoresist mask 102. The topography of fences 106 can lead to defectivity and reliability issues.

To summarize, removal of MR structural layer 68 using a wet etch process, demonstrated in FIGS. 2-4, leads to poor critical dimension control. As demonstrated in FIGS. 5-9, replacement of the wet etch process with a dry etch process might yield improvements in critical dimension control. However, a dry etch process with a long duration and a high incident beam angle to prevent re-deposition of the magnetoresistive material results in a large step 88. This large step 88 detrimentally increases the potential for manufacturing defects, and in particular, lifting or peeling of the magnetoresistive material due at least in part to stresses caused by the height of step 88. As further demonstrated in FIGS. 10-11, a shorter dry etch process can reduce the height of step 88. However, the shorter etch time increases the probably of re-deposition of the magnetoresistive material on sidewalls 104 of photoresist mask 102 and the formation of fences 106 following removal of photoresist mask 102.

Embodiments described below implement a dry etch process (e.g., ion beam etch process or ion milling) to achieve improvements in critical dimension control of the magnetoresistive structural layer, while concurrently avoiding the problems of lift-off or peeling of the magnetoresistive material and/or the re-deposition of the magnetoresistive material that could otherwise lead to defectivity issues, yield loss, reduced reliability, potential cross-contamination of tools, and high manufacturing costs.

Figure 12:
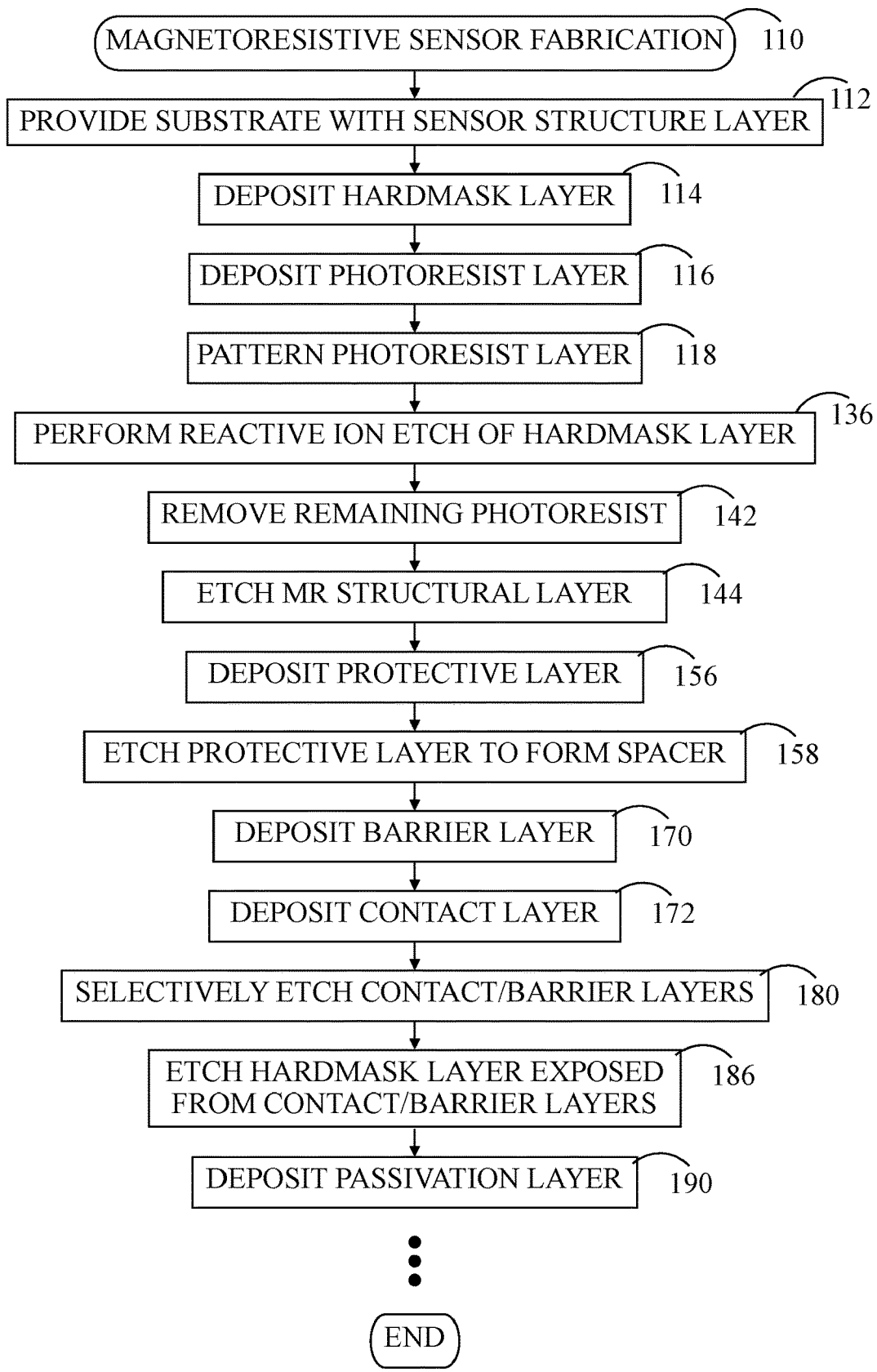
FIG. 12 shows a flowchart of a magnetoresistive sensor fabrication process in accordance with an embodiment.

With reference to FIG. 12, FIG. 12 shows a flowchart of a magnetoresistive (MR) sensor fabrication process 110 in accordance with an embodiment. MR sensor fabrication process 110 may be implemented to fabricate magnetic field sensor 20. Accordingly, reference should be made concurrently to FIG. 1 in connection with the following description. Although, fabrication process 110 is discussed in connection with the fabrication of magnetic field sensor 20, it should be understood that a magnetic field sensor may have more than or less than the illustrated quantity of MR sensor structures 30, 32, 34, 36, stripes 37 of magnetoresistive material (e.g., a NiFe composition), and so forth. Further the magnetic field sensor may be configured to detect an externally-applied magnetic field along one or more orthogonal directions.

At a block 112 of MR sensor fabrication process 110, a substrate is provided with a magnetoresistive structural layer formed thereon. At a block 114, a hardmask layer is deposited over the MR structural layer. At a block 116, a photoresist layer is deposited over the hardmask layer, and at a block 118, the photoresist layer is suitably patterned in accordance with a design layout to expose a portion of the hardmask layer.

Figure 13:
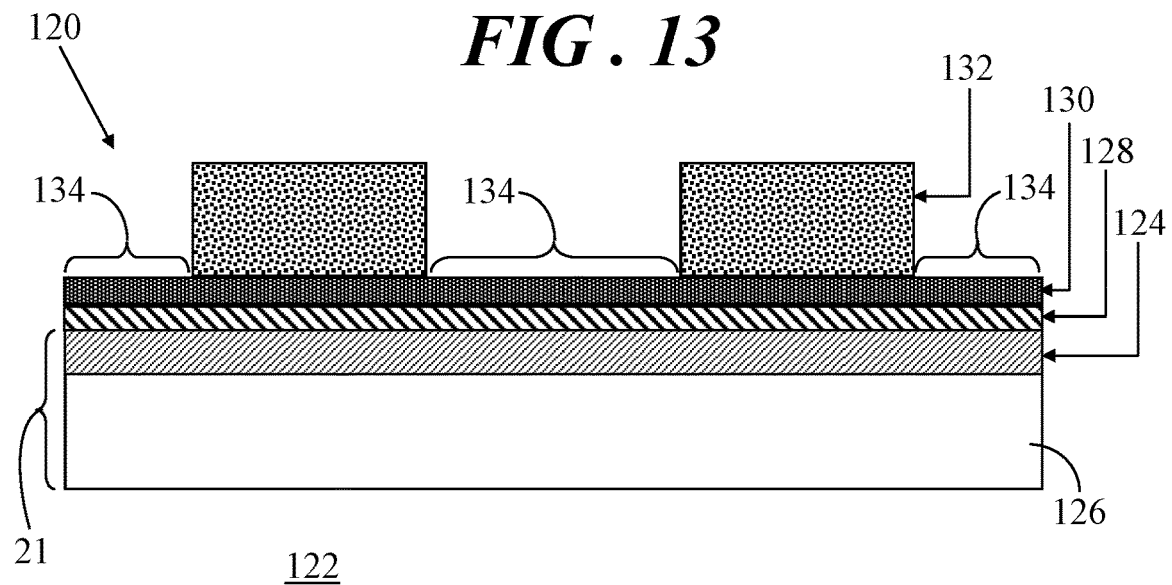
FIG. 13 shows a partial side view of a structure at an initial stage of processing in accordance with the magnetoresistive sensor fabrication process of FIG. 12.

Referring to FIG. 13 in connection with process blocks 112, 114, 116, 118 of fabrication process 110, FIG. 13 shows a partial side view of a structure 120 at an initial stage 122 of processing in accordance with MR sensor fabrication process 110. A dielectric layer 124 (e.g., an oxide or nitride) may be deposited or thermally grown on a silicon substrate 126 to form substrate 21 of FIG. 1. Alternatively, oxide layers may be formed on a complimentary metal-oxide-semiconductor (CMOS) substrate (not shown) containing an application specific integrated circuit (ASIC). A magnetoresistive structural layer 128 is deposited on dielectric layer 124. Magnetoresistive structural layer 128 may be formed of a magnetic material such as a NiFe composition, e.g., the composition $Ni_{80}Fe_{20}$, referred to as permalloy. Thus, substrate 21 with MR structural layer 128 deposited thereon is provided in accordance with block 112 of fabrication process 110.

A hardmask layer 130 is deposited over MR structural layer 128 in accordance with block 114 of fabrication process 110. In an embodiment, hardmask layer 130 may be formed from tungsten (W) or a tungsten-based composition, such as a titanium-tungsten (TiW) composition or a tungsten-nitride composition. As will be discussed below, a hardmask layer 130 of a tungsten, a titanium-tungsten composition, or a tungsten-nitride composition is preferred because it may be readily removed during a later wet etch process without damaging the underlying MR structural layer 128. Prior art fabrication methodologies have attempted to implement a tantalum (Ta) hardmask layer. However, etch processes for tantalum, that are selective to a NiFe composition and which will not contaminate MR structural layer 128, may not be available. A photoresist layer 132 is thereafter deposited over hardmask layer 130 in accordance with block 116 and is suitably patterned by, for example, photolithography, to expose portions 134 of hardmask layer 130 in accordance with block 118.

With reference back to fabrication process 110 (FIG. 12), at a block 136, an etch process is performed to remove the exposed portions 134 of hardmask layer 130 and thereby expose portions of magnetoresistive structural layer 128.

Figure 14:
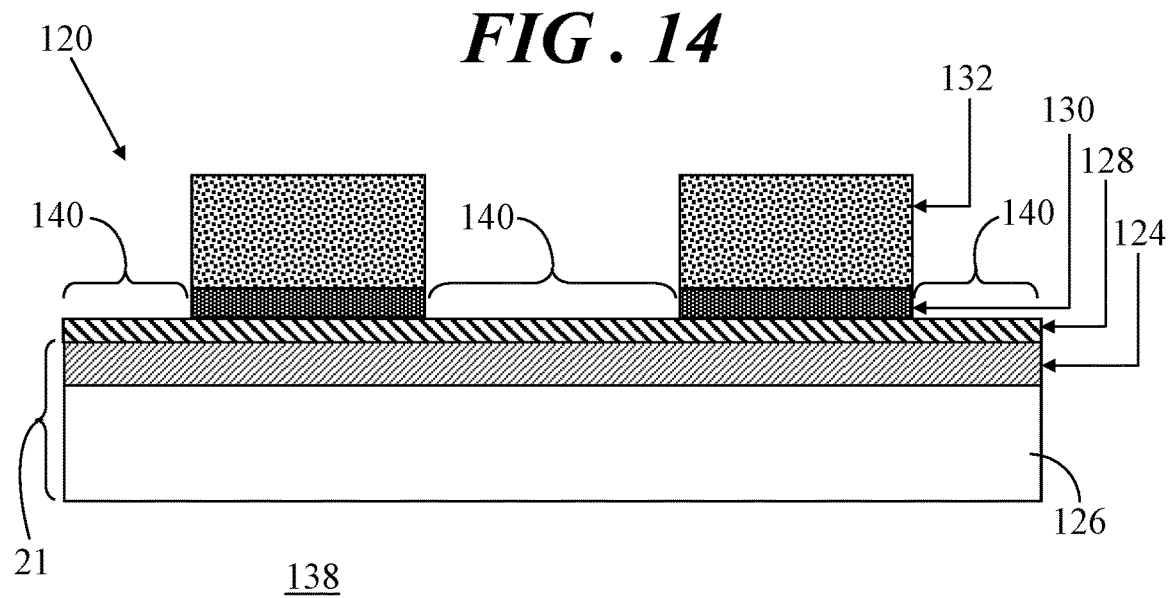
FIG. 14 shows a partial side view of the structure of FIG. 13 at a subsequent stage of processing.

Referring now to FIG. 14 in connection with process block 136 of fabrication process 110, FIG. 14 shows a partial side view of structure 120 of FIG. 13 at a subsequent stage 138 of processing. In some embodiments, a reactive-ion etch process may be performed to remove the exposed portions 134 (FIG. 13) of hardmask layer 130. The reactive-ion etch process may utilize a fluorocarbon (e.g., $CF_4$) plasma, a sulfur hexafluoride ($SF_6$) plasma, or any other suitable chemically reactive plasma that will not etch the underlying MR structural layer 128. As such, portions 140 of MR structural layer 128 are exposed. In alternative embodiments, a wet etch process using, for example, a liquid hydrogen peroxide ($H_2O_2$), may be performed at block 136 to remove the exposed portions 134 (FIG. 13) of hardmask layer 130. Again, hardmask layer 130 may be formed from a tungsten (W) or a titanium-tungsten (TiW) composition, which can be readily removed by a wet etch process using hydrogen peroxide without damaging the underlying MR structural layer 128.

With reference back to fabrication process 110 (FIG. 12), at a block 142, the remaining photoresist layer 132 (FIG. 14) is removed or stripped. After photoresist layer 132 is removed, a block 144 is performed. At block 144, a dry etch process is performed to remove the exposed portions 140 (FIG. 14) of MR structural layer 128 and produce magnetoresistive sensor structures (e.g., NiFe stripes 37 of the respective MR sensor structures 30, 32, 34, 36 of FIG. 1).

Figure 15:
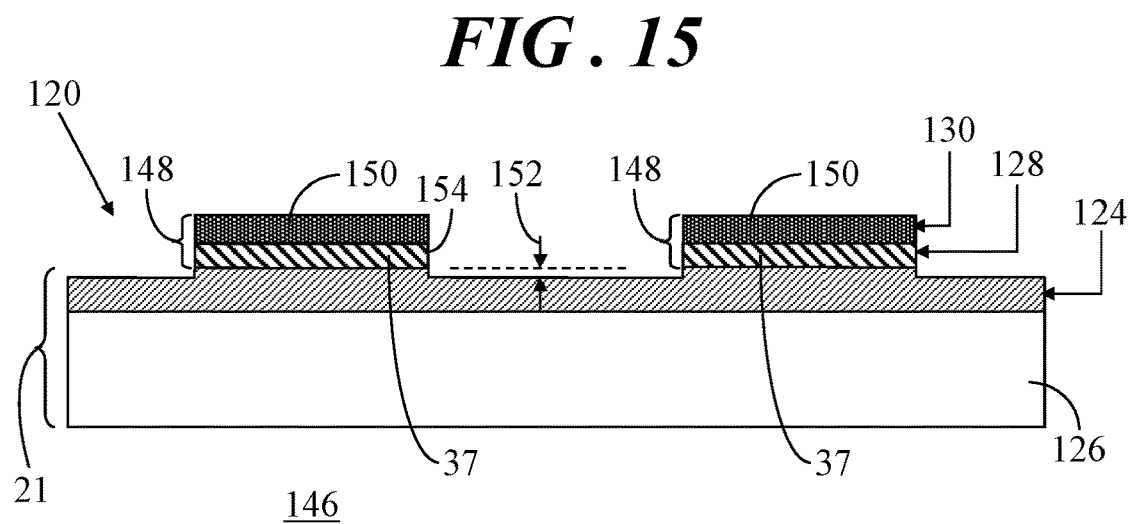
FIG. 15 shows a partial side view of the structure of FIG. 14 at a subsequent stage of processing.

Referring to FIG. 15 in connection with process blocks 142, 144 of fabrication process 110, FIG. 15 shows a partial side view of structure 120 of FIG. 14 at a subsequent stage 144 of processing. As shown, photoresist layer 132 (FIG. 14) has been stripped in accordance with block 142 such that the patterned hardmask layer 130 is exposed. Additionally, portions 140 (FIG. 14) of magnetoresistive structural layer 128 have been removed to form the MR sensor structures. In the illustrated example, the MR sensor structures include adjacent NiFe stripes 37 of one of MR sensor structures 30, 32, 34, 36 (FIG. 1). Only two NiFe stripes 37 are shown in FIG. 15 for simplicity. As such, NiFe stripes 37 of structure 120 represent only a small portion MR sensor structures 30, 32, 34, 36 of FIG. 1.

Following the ion beam etch process, a composite structure 148 remains that includes the MR sensor structure (e.g., NiFe stripes 37) and a hardmask section 150 of hardmask layer 130 overlying each of NiFe stripes 37. In some embodiments, the dry etch process (e.g., ion beam etching or ion milling) utilizes an inert gas, such as argon (Ar), krypton (Kr), or another suitable inert gas. An inert gas may be selected since it will not react or only minimally react with the underlying substrate (e.g., dielectric layer 124) so that no chemical reactions take place. Conversely, a reactive gas (e.g., carbon, hydrogen, and/or oxygen compositions) may be undesirable for dry etching of magnetoresistive structural layers due to the potential for reaction with the underlying substrate which could lead to adverse reliability issues.

A typical photoresist that may be used to form photoresist layer 132 may be as much as thirty times thicker than the tungsten-based hardmask layer 130. It can be observed in FIG. 15 that patterning of MR structural layer 128 by ion beam etching using the significantly thinner hardmask layer 130 as a mask in lieu of the relatively thicker photoresist layer 132 (FIG. 14) largely prevents the re-deposition and formation of fences (e.g., fences 106 of FIG. 11). This enables a small over etch into dielectric layer 124 to produce a significantly smaller step 152 than the prior art methodology that does not include hardmask layer 130. The significantly smaller height of step 152 effectively reduces stress, as discussed above, to largely eliminate the potential for lift-off or peeling of NiFe stripes 37.

With reference back to fabrication process 110 (FIG. 12), fabrication process 110 continues with a block 156 following process block 144 in some embodiments. At process block 156, a protective layer is deposited over the surface of substrate 21 and over composite structures 148 and at a process block 158, another etch process is performed to remove portions of the protective layer. Accordingly, following this etch process, spacers surrounding sidewalls of the composite structure are formed from a remaining portion of the protective layer.

Figure 16:
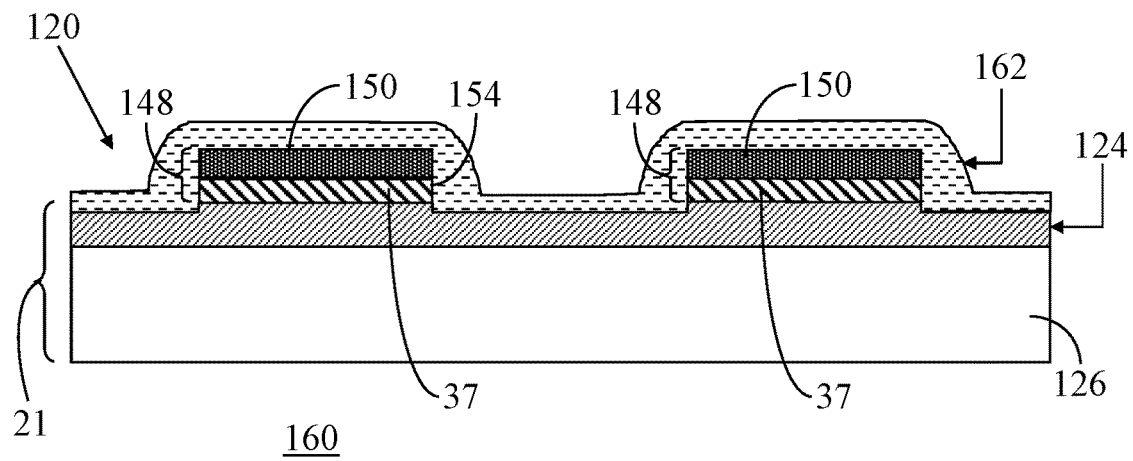
FIG. 16 shows a partial side view of the structure of FIG. 15 at a subsequent stage of processing.

Referring to FIG. 16 in connection with process block 156 of fabrication process 110, FIG. 16 shows a partial side view of structure 120 of FIG. 15 at a subsequent stage 160 of processing. As shown, a protective layer 162 is deposited over the surface of substrate 21 and over composite structures 148. In this example, protective layer 162 may be deposited at a thickness that is sufficient to fully encapsulate composite structures 148. A dielectric material such as a silicon nitride material, a silicon oxide material, tetraethyl orthosilicate (TEOS), oxide, and so forth may be utilized to form protective layer 162. Protective layer 162 may be deposited utilizing a plasma-enhanced chemical vapor deposition process (PECVD). PECVD is considered a low temperature (e.g., 250-400° C.) deposition process relative to, for example, rapid thermal chemical vapor deposition (RT-CVD). Low temperature PECVD at, for example, 250° C. to 300° C., may be desirable to avoid outdiffusion of, for example, titanium from hardmask sections 150 into NiFe stripes 37, which might otherwise adversely affect device performance and yield.

Figure 17:
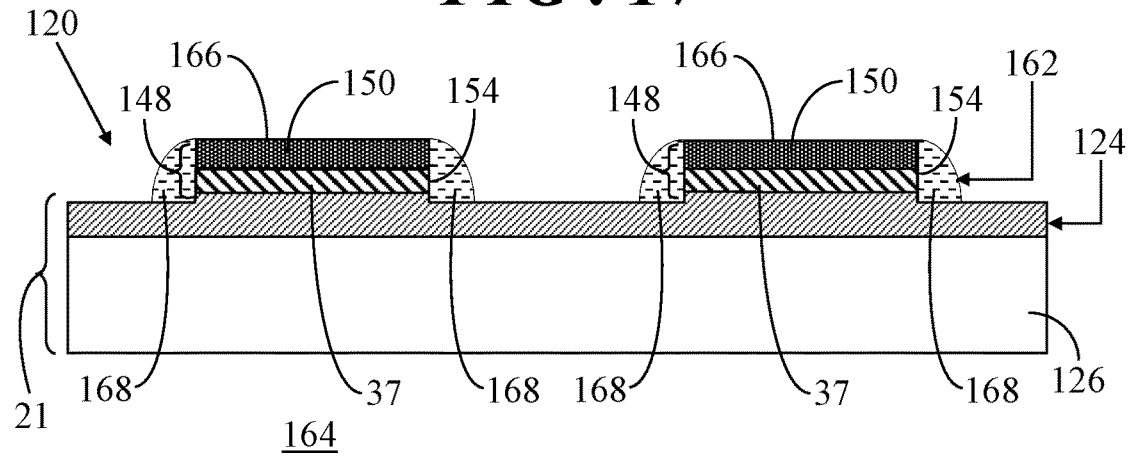
FIG. 17 shows a partial side view of the structure of FIG. 16 at a subsequent stage of processing.

With reference to FIG. 17 in connection with process block 158 of fabrication process 110, FIG. 17 shows a partial side view of structure 120 of FIG. 16 at a subsequent stage 164 of processing. As shown, protective layer 162 has been etched to remove protective layer 162. Protective layer 162 may be etched utilizing a blanket etch process with, for example, a fluorocarbon ($CF_4$). Blanket etching may be performed at an etch rate of a suitable duration to remove a majority of protective layer 162 and to expose a top surface 166 (e.g., the top of hardmask sections 150) of composite structures 148, while leaving a remaining portion of protective layer 162 surrounding sidewalls 154 of composite structures 148. Thus, spacers 168 surrounding sidewalls 154 are formed from the remaining portion of protective layer 162 following the etching performed at process block 158. More particularly, following the blanket etch process, protective layer 162 remains surrounding sidewalls 154 to produce spacers 168 that reside on a top surface of dielectric layer 124 of substrate 21 immediately adjacent to sidewalls 154 and extend vertically from the top surface of dielectric layer 124 to additionally surround hardmask sections 150. As will be discussed below, spacers 168 can serve to effectively separate NiFe stripes 37 from an overlying barrier layer to eliminate the lift-off or peeling of NiFe stripes 37 (illustrated in FIGS. 8-9) that may occur in prior art methodologies.

With reference back to fabrication process 110 (FIG. 12), following process block 158, fabrication process 110 continues with a block 170. At block 170, a barrier layer is deposited over the surface of substrate 21, over composite structures 148, and over spacers 168 in some embodiments. Next, at a process block 172, a contact layer is deposited over the barrier layer.

Figure 18:
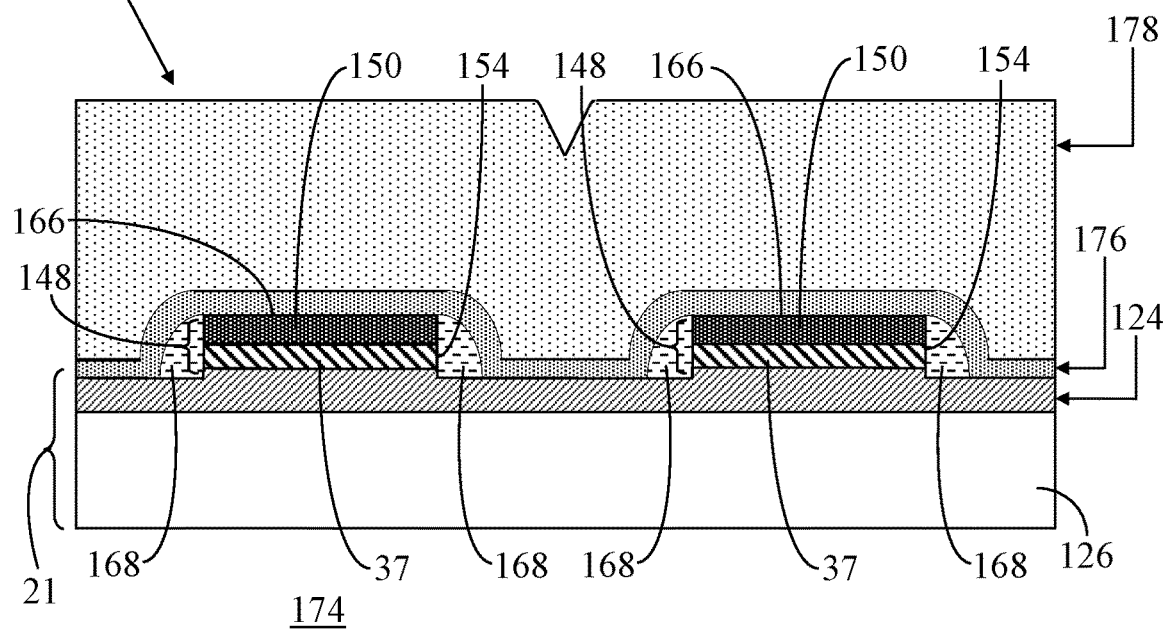
FIG. 18 shows a partial side view of the structure of FIG. 17 at a subsequent stage of processing.

Referring to FIG. 18 in connection with process blocks 170, 172, FIG. 18 shows a partial side view of structure 120 of FIG. 17 at a subsequent stage 174 of processing. As shown, a barrier layer 176 has been deposited over the surface of substrate 21, over composite structures 148, and over spacers 168 in accordance with process block 170. Additionally, a contact layer 178 has thereafter been deposited over barrier layer 176 (and therefore over composite structures 148, and over spacers 168) in accordance with process block 172.

In some embodiments, barrier layer 176 may be a titanium-nitride (TiN) composition or optionally, a titanium-tungsten (TiW) composition. Contact layer 178 may be an electrically conductive material with low electrical resistivity, such as an aluminum-copper (AlCu) composition. In other embodiments a barrier layer (e.g., barrier layer 176) is left out. The combination of hardmask sections 150, spacers 168, and barrier layer 176 isolates NiFe stripes 37 from contact layer 76. In the absence of this isolation, aluminum from contact layer 76 could diffuse into NiFe stripes 37 during thermal treatment which may degrade sensor performance. Further, the presence of spacers 168 can make the topography of structure 120 more gradual to facilitate the reduction of stress. Still further, spacers 168 may protect NiFe stripes 37 during later etching processes and/or ashing processes, discussed below, which may not be selective to a NiFe composition (i.e., the NiFe composition would be damaged if the NiFe is placed in directed contact with TiN barrier layer 176 at sidewalls 154).

Returning to sensor fabrication process 110 (FIG. 12), following the deposition of barrier and contact layers 176, 178 at process blocks 170, 172, fabrication process 110 continues with a block 180. At process block 180, contact layer 178 and barrier layers 176 are selectively structured (i.e., etched).

Figure 19:
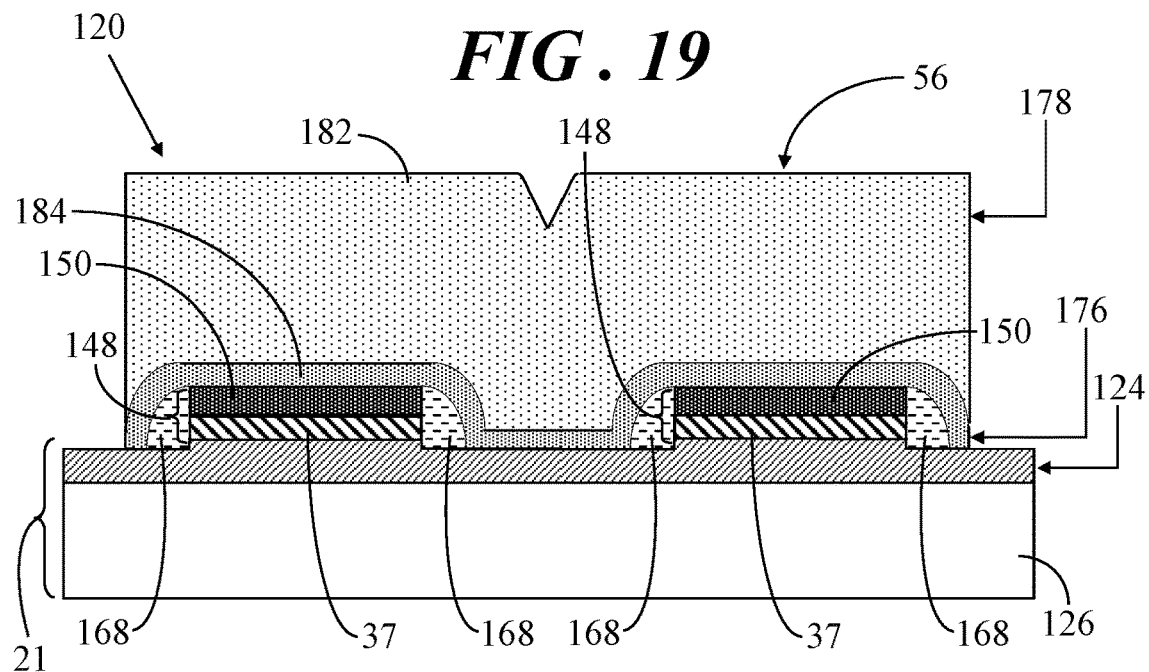
FIG. 19 shows a partial side view of a contact area of the structure of FIG. 18.
Figure 20:
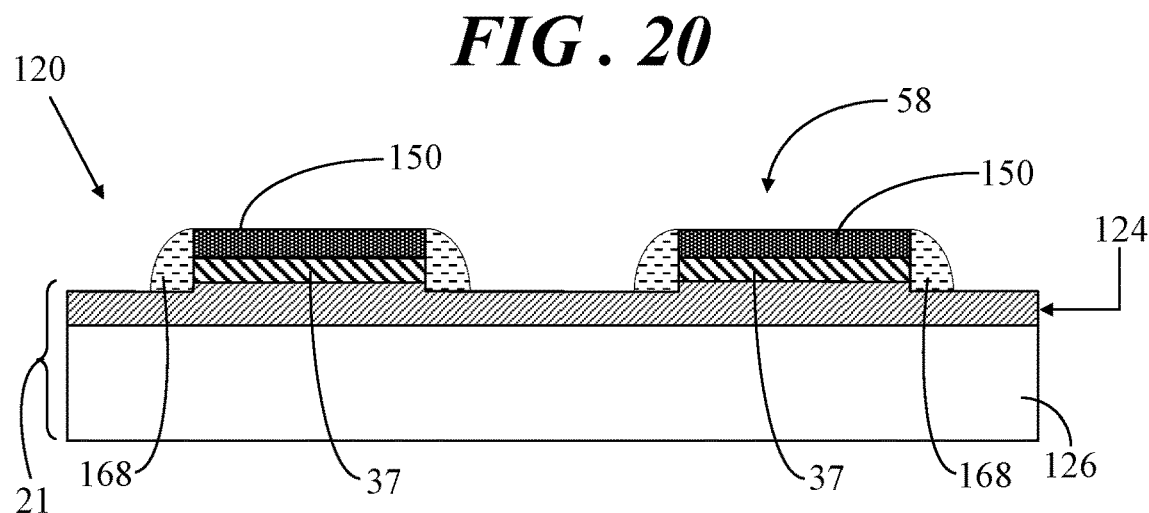
FIG. 20 shows a partial side view of a non-contact area of the structure of FIG. 18.

Referring to FIGS. 19 and 20 in connection with process block 180, FIG. 19 shows a partial side view of contact area 56 of structure 120 of FIG. 18 and FIG. 20 shows a partial side view of non-contact area 58 of the structure 120 of FIG. 18. It should be recalled that MR sensor fabrication process 110 is being described in connection with the fabrication of magnetic field sensor 20 (FIG. 1). As defined above, contact areas 56 are the regions at which the contact material (e.g., contact layer 178 in this example) electrically interconnects NiFe stripes 37. Conversely, non-contact areas 58 are the regions at which the contact material (e.g., contact layer 178 in this example) has been removed such that NiFe stripes are exposed from contact layer 178. In an example, structuring entails etching contact layer 178 using, for example, a photoresist mask and a reactive ion etch process. Barrier layer 176 may thereafter be structured using a wet etch process, with the remaining contact layer 178 serving as a hardmask. Contact layer 178 may additionally be suitably structured to form the bond pads, conductive traces to the bond pads of magnetic field sensor 20, and the like. Spacers 166 and hardmask sections 150 isolate NiFe stripes 37 from contact layer 178 and barrier layer 176 during the reactive ion etch process, which is not selective to NiFe.

In FIG. 19, contact layer 178 and barrier layer 176 have been suitably etched to form an electrically conductive contact 182. That is, a portion 184 of barrier layer 176 remains interposed between hardmask section 150 and electrically conductive contact 182 at contact area 56. Thus, electrical interconnection of a pair of NiFe stripes 37 via the electrically conductive hardmask section 150, portion 184 of barrier layer 176, and electrically conductive contact 182 occurs at contact area 56. Only one contact area 56 is shown in FIG. 19 for simplicity. However, as shown in FIG. 1, magnetic field sensor 20 may include a multiplicity of contact areas 56 interconnecting individual NiFe stripes 37 to form MR sensor structures 30, 32, 34, 36 of sensor legs 22, 24, 26, 28.

In FIG. 20, contact layer 178 and barrier layer 176 have been suitably etched to expose hardmask sections 150 at non-contact areas 58. Accordingly, at non-contact areas 58 there is not a direct physical interconnection of NiFe stripes 37 via hardmask section 150, portion 184 of barrier layer 176. Again, as shown in FIG. 1, magnetic field sensor 20 may include a multiplicity of non-contact areas 58 that are exposed from contact layer 178 for detecting external magnetic field 38.

Returning to sensor fabrication process 110 (FIG. 12), following the selective etching of contact and barrier layers 178, 176 at process block 180, a block 186 is performed. At block 186, the hardmask layer that was exposed from the contact and barrier layers is etched.

Figure 21:
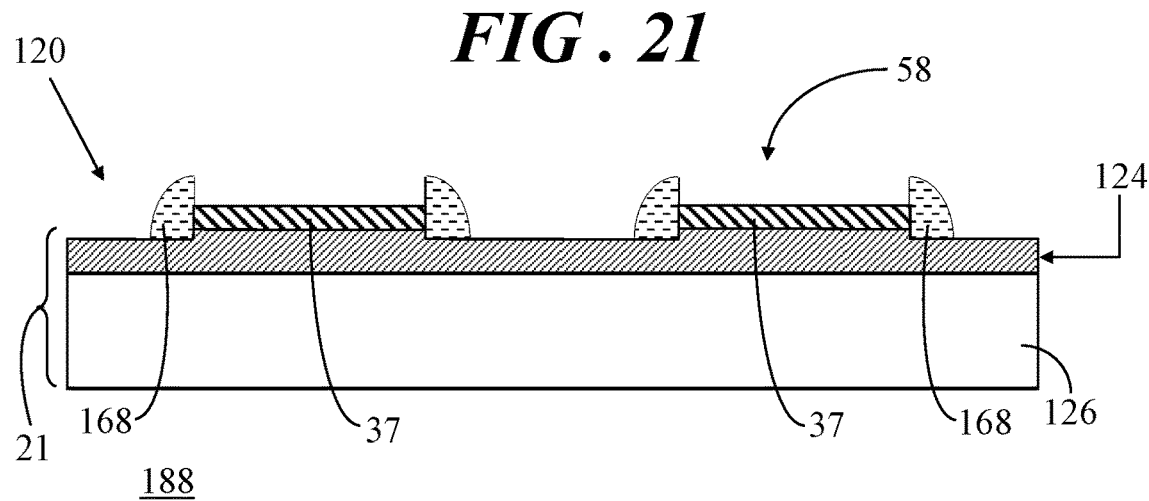
FIG. 21 shows a partial side view of the structure of FIG. 20 at a subsequent stage of processing.

Referring to FIG. 21 in connection with process block 186, FIG. 21 shows a partial side view of structure 120 of FIG. 20 at a subsequent stage 188 of processing. In FIG. 21, hardmask sections 150 have been suitably structured to remove hardmask sections 150 (FIG. 20) from NiFe stripes 37 at non-contact areas 58. For example, a photoresist material (not shown) may be deposited and patterned, and hardmask sections 150 may be etched using, for example a wet etch process. Thereafter, the photoresist material is stripped from structure 120. Due to the relatively small height of step 152 and/or the presence of spacers 168, etching of contact layer 178 using a reactive dry etch process and a subsequent ashing process to remove the photoresist material is less likely to result in lift-off or peeling of NiFe stripes 37 from the underlying dielectric layer 124 of substrate 21. In another embodiment, in the case in which tungsten or a titanium-tungsten composition is used for the hardmask layer, hardmask sections 150 may be etched using a wet etch process an non-contact areas 58. As such, no photoresist material is required because wet etching with hydrogen peroxide will not etch any of the contact material (e.g., AlCu), dielectric spacers 168, or dielectric layer 124.

Returning to sensor fabrication process 110 (FIG. 12), following the removal of hardmask sections 150 exposed from contact and barrier layers 178, 176 at process block 186, a block 190 may be performed. At block 190, a passivation layer may be deposited over the structure. Fabrication process 110 may continue with additional operations not expressly described herein. These additional operations may include opening of the passivation above the bondpads, annealing of the NiFe material, wafer coat deposition, patterning and curing, wafer level testing and calibration, dicing, packaging, and the like. These additional operations are represented by ellipses in FIG. 12. Thereafter, sensor fabrication process 110 ends.

Figure 22:
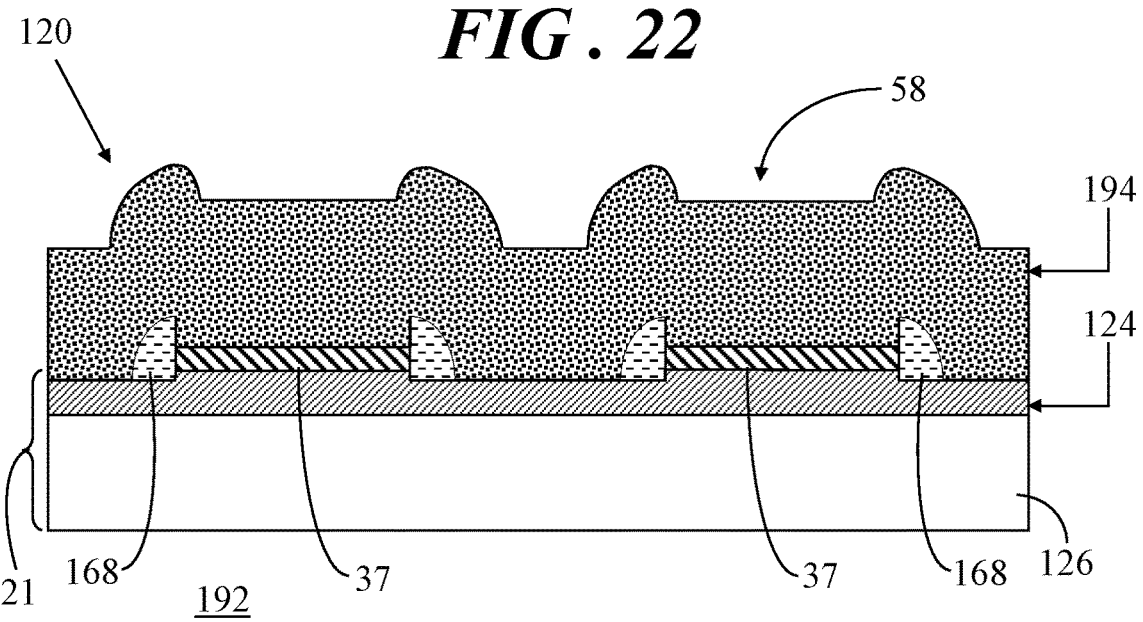
FIG. 22 shows a partial side view of the structure of FIG. 21 at a subsequent stage of processing.

Referring to FIG. 22 in connection with process block 190, FIG. 22 shows a partial side view of structure 120 of FIG. 21 at a subsequent stage 192 of processing. In FIG. 22, a passivation layer 194 is shown having been deposited over NiFe stripes 37 at non-contact areas 58. Of course, passivation layer 194 may also be deposited over contact areas 56 (represented in FIG. 19) as well. Passivation layer 194 may be a protective material, such as silicon nitride or a double layer of silicon oxide and silicon nitride, that can be used to protect the semiconductor surfaces.

Accordingly, the operations of MR sensor fabrication process 110 (FIG. 12) can enable robust manufacturing of densely located MR structures of small magnetic area that may be incorporated into sensor systems having, for example, several full and half bridge architectures. In particular, dry etching of the magnetoresistive material can be performed to achieve improvements in critical dimension control. Additionally, the use of a relatively thin hardmask layer of tungsten or a titanium-tungsten composition (in lieu of a conventional thicker photoresist layer) for dry etching of the MR material can allow for a reduction of over etch into the underlying dielectric substrate to produce a significantly smaller step height and thereby effectively reduce stresses so as to largely eliminate the potential for lift-off or peeling of the MR structures. Further, the thin hardmask layer (in lieu of a conventional thicker photoresist layer) largely prevents the re-deposition of MR material. Still further, the inclusion of spacers further reduces potential for lift-off or peeling of the MR structures, isolates the MR material to limit the potential for diffusion of materials (e.g., aluminum from the contact material) into the MR material, and protects the MR material during later etching processes and stripping of photoresist which might not be selective to the MR material composition. Although MR sensor fabrication process 110 includes both the hardmask layer and the spacers to enable robust manufacturing, alternative embodiments may entail the use of only the hardmask layer or only the spacers, as discussed below.

Figure 23:
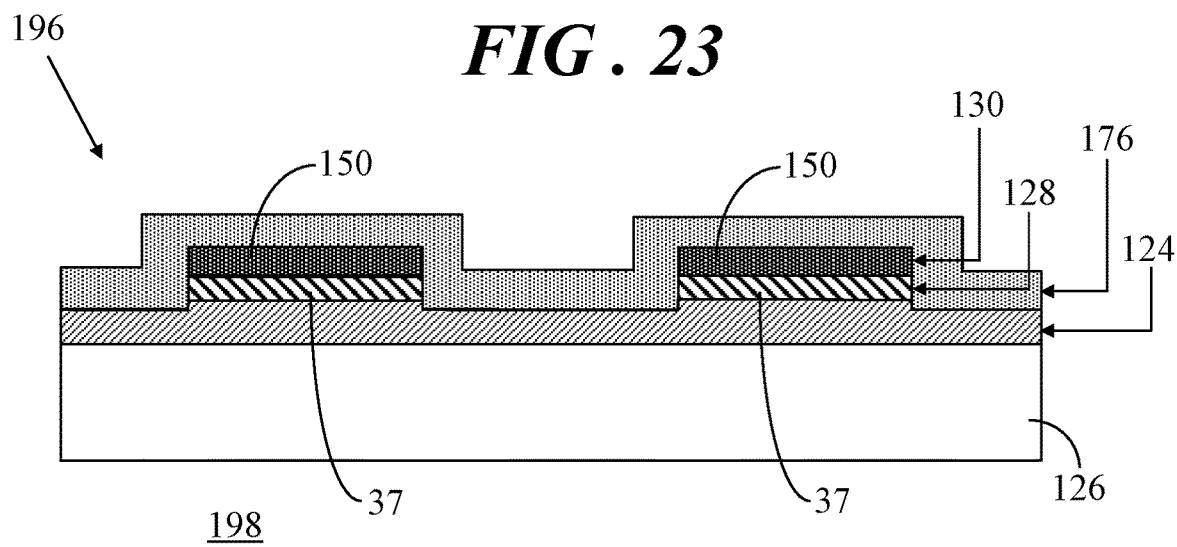
FIG. 23 shows a partial side view of a structure at an intermediate stage of processing in accordance with another embodiment.

FIG. 23 shows a partial side view of a structure 196 at an intermediate stage 198 of processing in accordance with another embodiment. Structure 196 has been fabricated in accordance with process blocks 112, 114, 116, 118, 136, 142, 144, and 170 of MR sensor fabrication process 110 (FIG. 12) and abstaining from performing the spacer formation process blocks 156, 158. As such, structure 196 includes silicon substrate 126 with dielectric layer 124 deposited or thermally grown thereon, composite structures 148 of magnetoresistive stripes 37 and hardmask sections 150, and barrier layer 176 deposited thereon. Subsequent operations of MR sensor fabrication process 110 can entail deposition of the contact layer (process block 172), structuring of the contact and barrier layers (process block 180), etching of the hardmask layers (process block 186), and deposition of a passivation layer (process block 190), as discussed in detail above.

Figure 24:
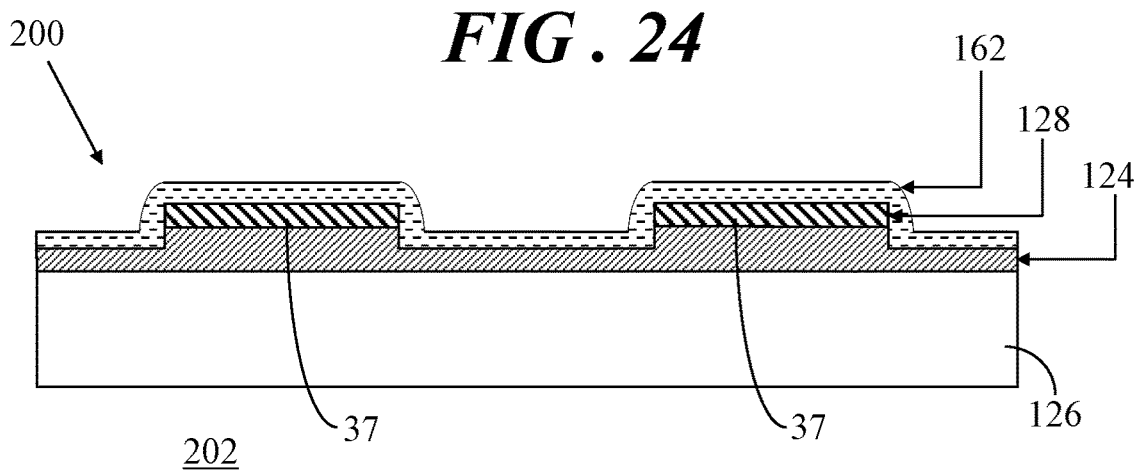
FIG. 24 shows a partial side view of another structure at an intermediate stage of processing in accordance with yet another embodiment.
Figure 25:
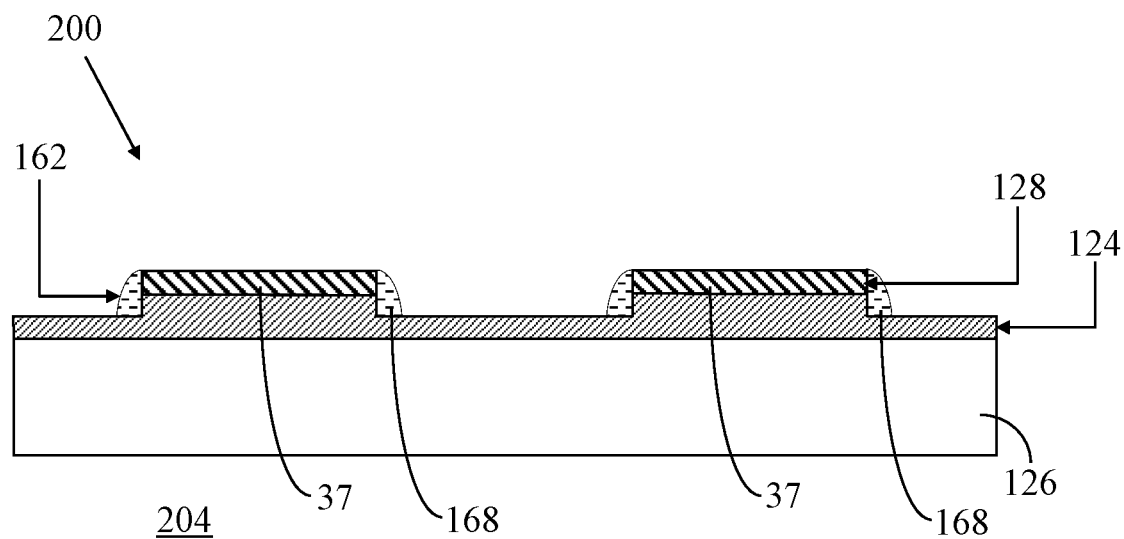
FIG. 25 shows a partial side view of the structure of FIG. 24 at a subsequent stage of processing.
Figure 26:
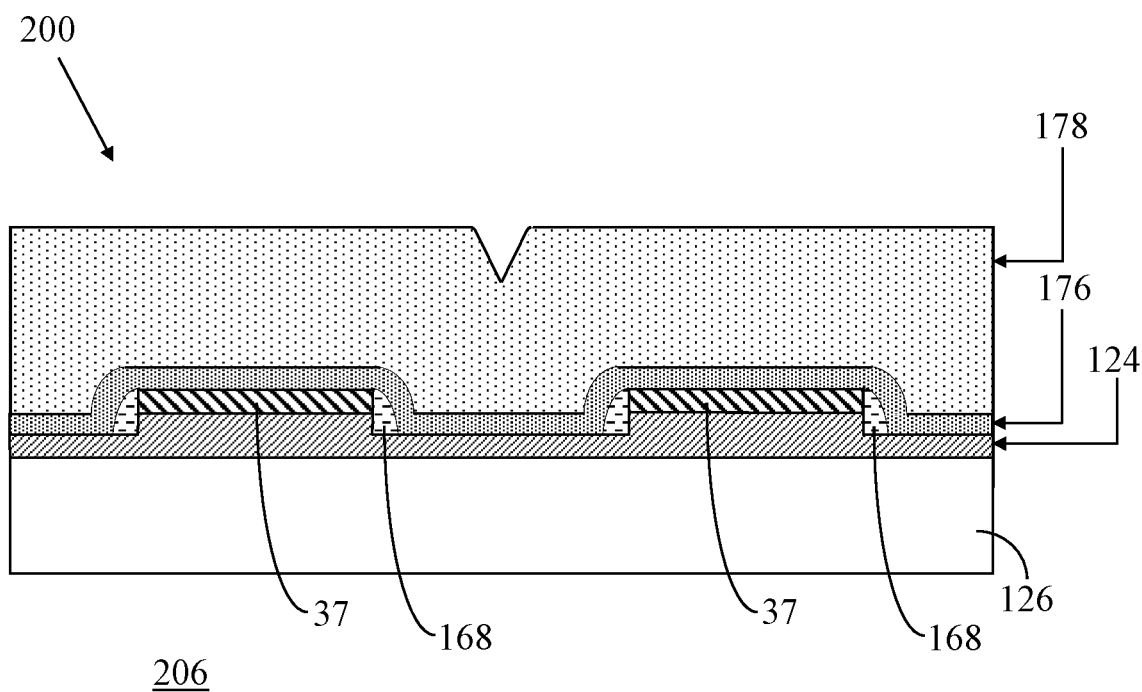
FIG. 26 shows a partial side view of the structure of FIG. 25 at a subsequent stage of processing.

FIGS. 24-26 demonstrate fabrication processes that include the spacers but not the use of the hardmask layer. First referring to FIG. 24, FIG. 24 shows a partial side view of another structure 200 at an intermediate stage 202 of processing in accordance with yet another embodiment. Structure 200 has been fabricated in accordance with process blocks 112, 116, 118, 144, 156 of MR sensor fabrication process 110 and abstaining from performing the process blocks relevant to the hardmask, e.g., process blocks 114, 136, 142. Following, etching of the MR structural layer at process block 144, the photoresist layer can be removed. As such, structure 200 includes silicon substrate 126 with dielectric layer 124 deposited or thermally grown thereon, and protective layer 162 deposited over magnetoresistive stripes 37.

FIG. 25 shows a partial side view of structure 200 of FIG. 24 at a subsequent stage 204 of processing. At stage 204, protective layer 162 has been suitably etched in accordance with process block 158 (FIG. 12) of MR sensor fabrication process 110 to form spacers 168.

FIG. 26 shows a partial side view of structure 200 of FIG. 25 at a subsequent stage 206 of processing. Following formation of spacers 168, subsequent operations of MR sensor fabrication process 110 can entail deposition of barrier layer 176 (process block 170), deposition of contact layer 178 (process block 172), structuring of the contact and barrier layers (process block 180), and deposition of a passivation layer (process block 190), as discussed in detail above.

Thus, execution of MR sensor fabrication process 110 enables the implementation of a dry etch process (e.g., ion beam etch process or ion milling) to achieve improvements in critical dimension control of a magnetoresistive structural layer, while concurrently avoiding the problems of lift-off or peeling of the magnetoresistive material and/or the re-deposition of the magnetoresistive material that could otherwise lead to defectivity issues, yield loss, reduced reliability, potential cross-contamination of tools, and high manufacturing costs. It should be understood that certain ones of the process blocks depicted in FIG. 12 may be performed in parallel with each other or with performing other processes. In addition, the particular ordering of the process blocks depicted in FIG. 12 may be modified, while achieving substantially the same result. Accordingly, such modifications are intended to be included within the scope of the inventive subject matter.

Previous discussion was largely directed to the fabrication of AMR magnetic field sensors. Again, MR sensor fabrication process 110 (FIG. 12) may be adapted for other magnetoresistive technologies, e.g., TMR, GMR, and so forth.

FIGS. 27-30, discussed below, demonstrate fabrication processes associated with tunnel magnetoresistive (TMR) structures.

Figure 27:
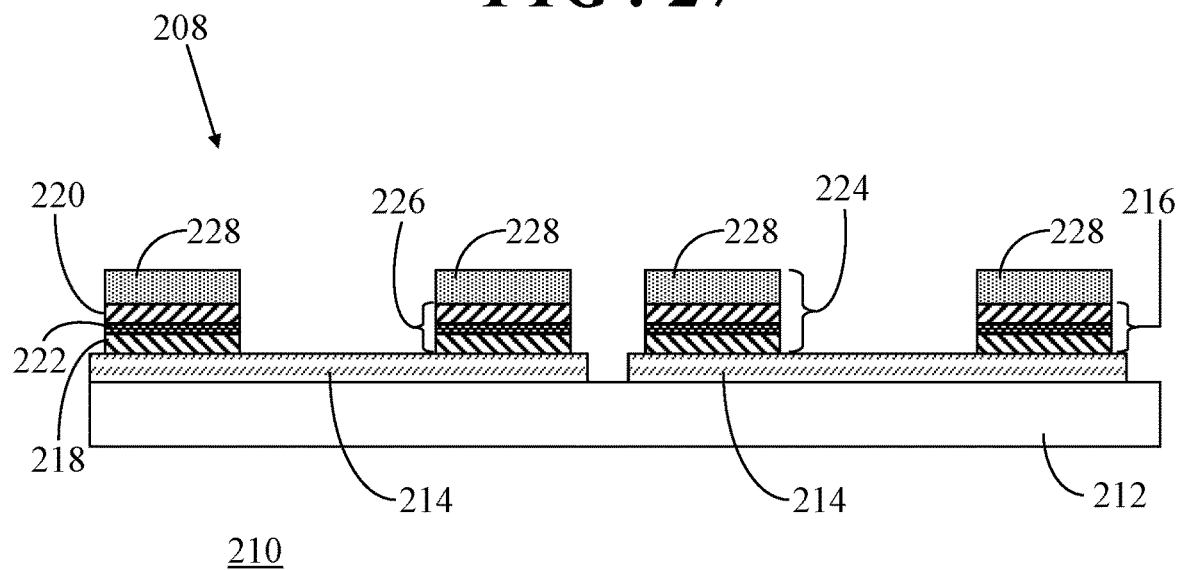
FIG. 27 shows a partial side view of a structure at an intermediate stage of processing in accordance with another embodiment.

Referring now to FIG. 27, FIG. 27 shows a partial side view of a structure 208 at an intermediate stage 210 of processing in accordance with another embodiment. Structure 210 has been fabricated in accordance with process blocks 112, 114, 116, 118, 136, 142, 144 of MR sensor fabrication process 110 (FIG. 12). In this example, at process block 112, a substrate 212 is provided having bottom electrodes 214 deposited thereon, and a magnetoresistive structural layer 216 formed on bottom electrode layer 214. In this example, magnetoresistive structural layer 216 includes magnetic layers 218, 220 (one of which is a free layer and the other of which may be a fixed/reference layer) separated by an insulator layer, commonly referred to as a tunnel junction 222. The fixed layer may be fixed to have a reference magnetization and the free layer is "free" to respond to, i.e., sense, the applied magnetic field. In accordance with the process blocks of MR sensor fabrication process 110 (FIG. 12), composite structures 224 remain following the dry etch process of block 144, each of composite structures 224 including an MR sensor structure 226 (typically referred to as a TMR stack) and a hardmask section 228 of the hardmask layer overlying MR sensor structure 226.

Figure 28:
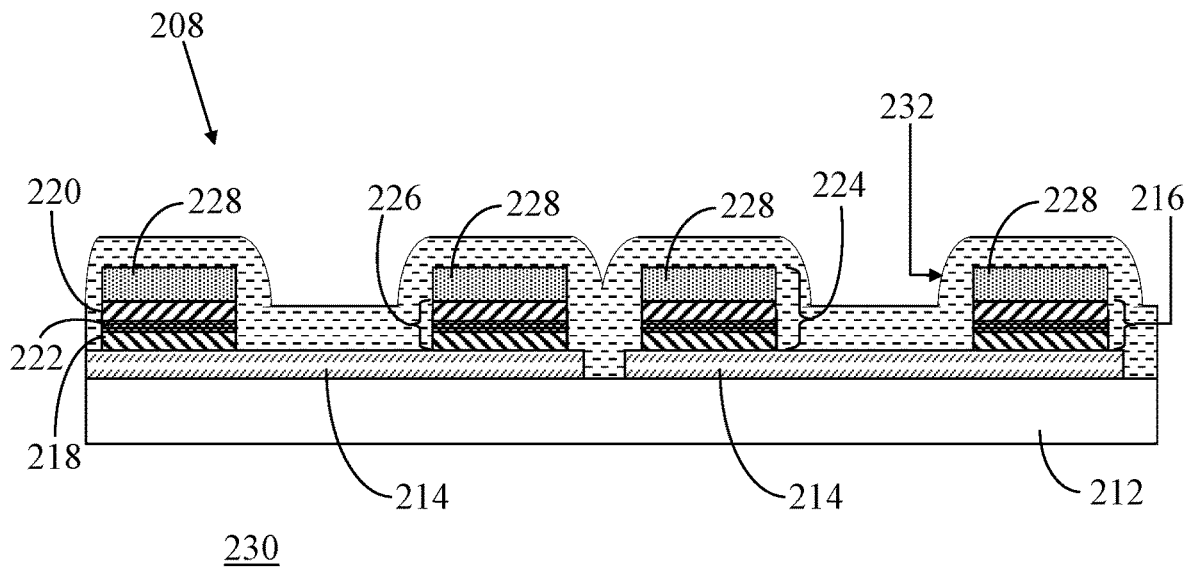
FIG. 28 shows a partial side view of the structure of FIG. 27 at a subsequent stage of processing.

FIG. 28 shows a partial side view of structure 208 of FIG. 27 at a subsequent stage 230 of processing. At stage 230, a protective layer 232 (e.g., a dielectric such as nitride, oxide, or TEOS) has been deposited by PECVD over composite structures 224, bottom electrode layer 214 and the exposed portions of substrate 212 in accordance with block 156 of MR sensor fabrication process 110 (FIG. 12).

Figure 29:
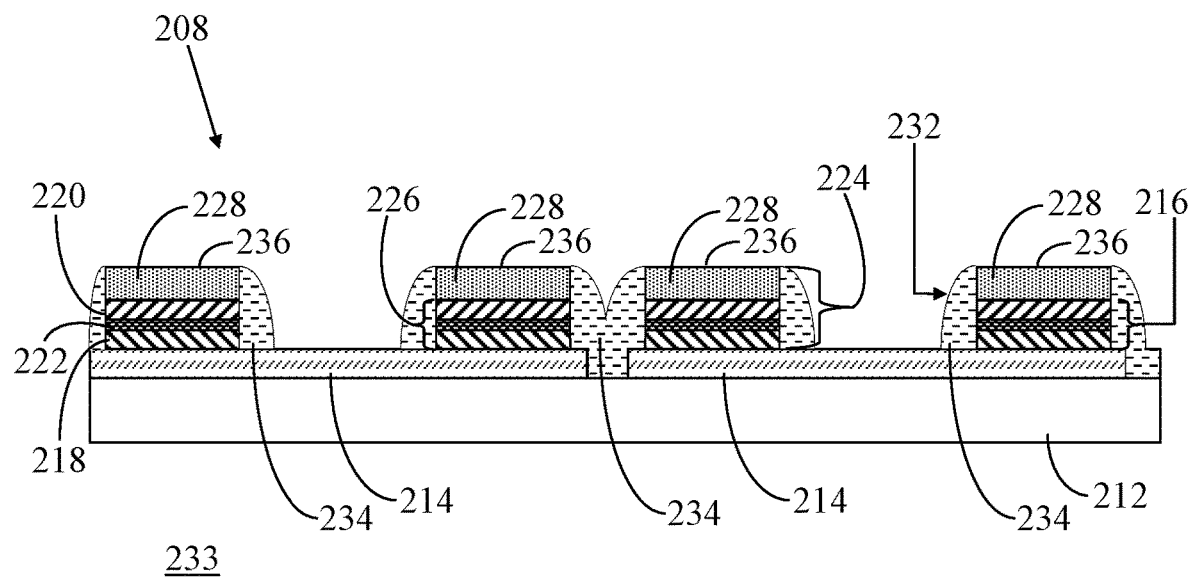
FIG. 29 shows a partial side view of the structure of FIG. 28 at a subsequent stage of processing.

FIG. 29 shows a partial side view of structure 208 of FIG. 28 at a subsequent stage 233 of processing. At stage 233, protective layer 232 has been blanket etched with, for example, $CF_4$, in accordance with block 158 to form spacers 234 surrounding composite structures 224 and to expose top surfaces 236 of composite structures 224.

Figure 30:
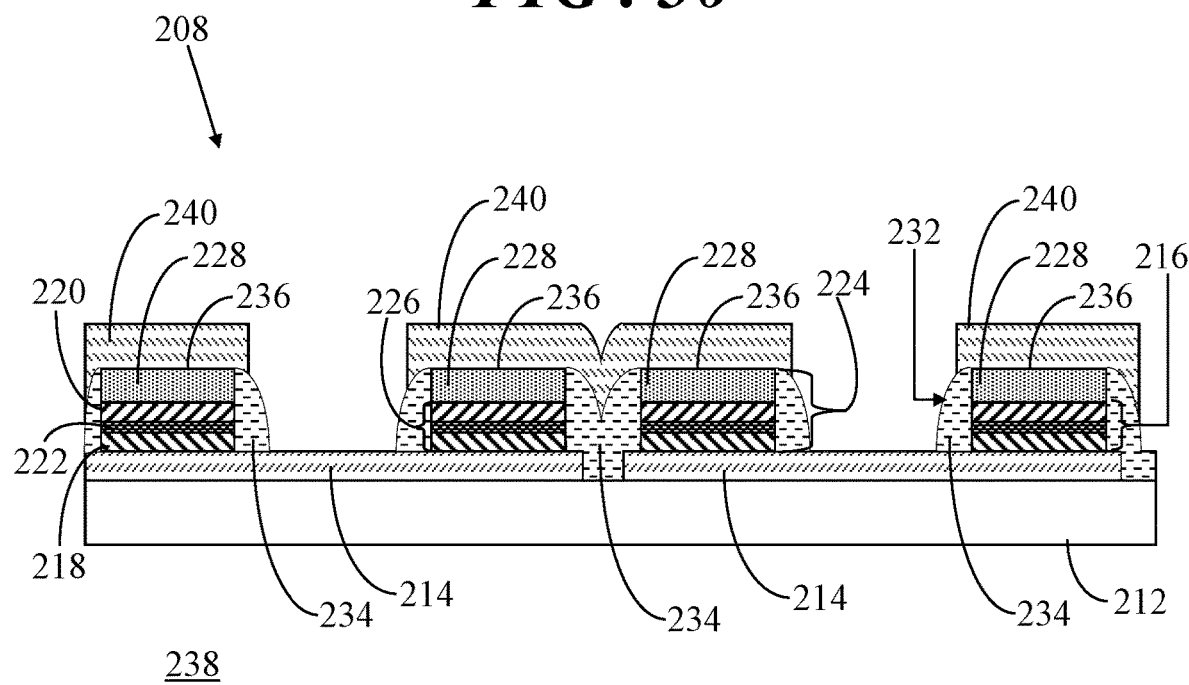
FIG. 30 shows a partial side view of the structure of FIG. 29 at a subsequent stage of processing.

FIG. 30 shows a partial side view of structure 208 of FIG. 29 at a subsequent stage 238 of processing. At stage 238, an electrically conductive contact layer has been deposited over structure 208 in accordance with block 172 and has been structured in accordance with block 180 of MR sensor fabrication process 110 (FIG. 12) to form electrically conductive contacts, referred to therein as top electrodes 240.

TMR magnetic field sensors may not suffer from the defectivity issues described above in connection with AMR magnetic field sensors. Nevertheless, executing MR sensor fabrication process 110 to manufacture TMR sensors enables a reduction in the number of mask layers. No via is required on top of the TMR stack, as compared to conventional processing techniques. Therefore, MR sensor fabrication process 110 may be implemented to fabricate TMR magnetic field sensors so as to reduce process complexity (relative to prior art TMR sensor fabrication processes) and therefore reduce manufacturing costs.

Embodiments disclosed herein entail magnetic field sensors and robust manufacturing of high performance magnetoresistive (MR) sensors. An embodiment of a method comprises depositing a hardmask layer over a magnetoresistive (MR) structural layer formed on a substrate, the hardmask layer being formed from tungsten or a titanium-tungsten composition, depositing a photoresist layer over the hardmask layer, patterning the photoresist layer to expose a first portion of the hardmask layer, performing a first etch process to remove the first portion of the hardmask layer and expose a second portion of the MR structural layer, and performing a dry etch process to remove the second portion of the MR structural layer and produce an MR sensor structure, wherein following the dry etch process, a composite structure remains that includes the MR sensor structure and a hardmask section of the hardmask layer, the hardmask section overlying the MR sensor structure.

Another embodiment of a method comprises depositing a hardmask layer over a magnetoresistive (MR) structural layer formed on a substrate, the hardmask layer being formed from tungsten or a titanium-tungsten composition, depositing a photoresist layer over the hardmask layer, patterning the photoresist layer to expose a first portion of the hardmask layer, performing a first etch process to remove the first portion of the hardmask layer and expose a second portion of the MR structural layer, removing a remaining portion of the photoresist layer following the first etch process, and following removing the remaining portion of the photoresist layer, performing an ion beam etch process using an inert gas to remove the second portion of the MR structural layer and produce a MR sensor structure, wherein following the dry etch process, a composite structure remains that includes the MR sensor structure and a hardmask section of the hardmask layer, the hardmask section overlying the MR sensor structure.

An embodiment of magnetic field sensor comprises a composite structure formed on a substrate. The composite structure comprises a magnetoresistive (MR) sensor structure and a hardmask section overlying the MR sensor structure at a contact area of the MR sensor structure, the hardmask section being formed from tungsten or a titanium-tungsten composition, wherein the hardmask section is absent from the MR sensor structure at a non-contact area of the MR sensor structure such that the MR sensor structure is exposed from the hardmask section at the non-contact area. The magnetic field sensor further comprises an electrically conductive contact formed at the contact area such that the hardmask section is interposed between the electrically conductive contact and the MR sensor structure, the electrically conductive contact being configured for connection to another MR sensor structure.

Accordingly, embodiments described herein entail precision patterning of the magnetic layer(s) using a dry etching technique while concurrently reducing manufacturing defects, cross contamination of manufacturing tools, and manufacturing costs. Dry etching of the magnetic layer may overcome the poor critical dimension control resulting from wet etching in order to achieve high performance AMR, GMR, and TMR sensors. The use of a reactive ion etchable hardmask for NiFe dry etching may avoid the defectivity issues related to residue re-deposition from NiFe patterning and peeling or lift-off of the NiFe composition during manufacturing. Further, no additional mask layer is needed, relative to prior art methodology. Instead, only an additional deposition and etch step is needed which do not significantly increase process complexity over prior art methodology. The fabrication and use of a dielectric spacer at the patterned edges of the magnetoresistive structures provides a solution for overcoming yield and defectivity issues related to dry etching of the magnetoresistive layer and contacting the magnetoresistive layer from the top. The dielectric spacer also requires no additional mask layer. Instead, only an additional deposition and etch step is needed which again do not significantly increase process complexity over prior art methodology. Using the reactive ion etchable hardmask for NiFe dry etching in combination with the dielectric spacers enables the manufacture of high performance AMR and GMR sensors. Precision etching of the magnetic layers(s) can enable the manufacture of dense MR structures of small magnetic area that may be incorporated into sensor systems having several full and half bridge architectures. In this way, MR sensors which are largely immune to high magnetic perturbation fields can be manufactured, for example, using a gradient technique. Still further, using the methodology described herein for manufacturing TMR sensors may enable a reduction in process complexity and manufacturing costs.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A method comprising:
    depositing a hardmask layer over a magnetoresistive (MR) structural layer formed on a substrate, the hardmask layer being formed from tungsten or a tungsten-based composition;
    depositing a photoresist layer over the hardmask layer;
    patterning the photoresist layer to expose a first portion of the hardmask layer;
    performing a first etch process to remove the first portion of the hardmask layer and expose a second portion of the MR structural layer;
    performing a dry etch process to remove the second portion of the MR structural layer and produce an MR sensor structure, wherein following the dry etch process, a composite structure remains that includes the MR sensor structure and a hardmask section of the hardmask layer, the hardmask section overlying the MR sensor structures;
    depositing a contact layer over the composite structure; and
    structuring the contact layer to form an electrically conductive contact at a contact area of the composite structure, the electrically conductive contact being configured for connection to another MR sensor structure, and the hardmask section being interposed between the electrically conductive contact and the MR sensor structure at the contact area, wherein the structuring operation includes removing the contact layer and the hardmask section from a non-contact area of the composite structure to expose the MR sensor structure at the non-contact area.

2. The method of claim 1 wherein the first etch process is a reactive ion etch process.

3. The method of claim 2 wherein the reactive ion etch process utilizes a sulfur hexafluoride plasma or a fluorocarbon plasma.

4. The method of claim 1 further comprising removing a remaining portion of the photoresist layer following performing the first etch process and prior to performing the dry etch process.

5. The method of claim 1 wherein the dry etch process is an ion beam etch or ion milling process that utilizes an inert gas.

6. The method of claim 1 further comprising:
depositing a barrier layer over the composite structure prior to the depositing the contact layer, the barrier layer including a titanium composition; and
structuring the barrier layer such that a portion of the barrier layer remains interposed between the hardmask section and the contact layer at the contact area, wherein the structuring the barrier layer includes removing the barrier layer from the non-contact area of the composite structure.

7. A method comprising:
depositing a hardmask layer over a magnetoresistive (MR) structural layer formed on a substrate, the hardmask layer being formed from tungsten or a tungsten-based composition;
depositing a photoresist layer over the hardmask layer;
patterning the photoresist layer to expose a first portion of the hardmask layer;
performing a first etch process to remove the first portion of the hardmask layer and expose a second portion of the MR structural layer;
performing a dry etch process to remove the second portion of the MR structural layer and produce an MR sensor structure, wherein following the dry etch process, a composite structure remains that includes the MR sensor structure and a hardmask section of the hardmask layer, the hardmask section overlying the MR sensor structure;
following performing the dry etch process, depositing a protective layer over the composite structure; and
performing a third etch process to remove the protective layer, wherein in response to the third etch process, a top surface of the composite structure is exposed from the protective layer, and a spacer is formed from a remaining portion of the protective layer, the spacer surrounding sidewalls of the composite structure.

8. The method of claim 7 wherein the depositing the protective layer comprises utilizing a plasma-enhanced chemical vapor deposition process (PECVD) to form the protective layer.

9. The method of claim 7 wherein following performing the third etch process, the method further comprises:
depositing a contact layer over the composite structure, wherein the spacer surrounding the sidewalls of the composite structure provides a physical separation between the MR sensor structure and the contact layer;
structuring the contact layer to form an electrically conductive contact at a contact area of the composite structure, the electrically conductive contact being configured for connection to another MR sensor structure, and the hardmask section being interposed between the electrically conductive contact and the MR sensor structure at the contact area, wherein the structuring operation includes removing the contact layer and the hardmask section from a non-contact area of the composite structure to expose the MR sensor structure at the non-contact area.

10. A method comprising:
depositing a hardmask layer a magnetoresistive (MR) structural layer formed on a substrate, the hardmask layer being formed from tungsten or a tungsten-based composition;
depositing a photoresist layer over the hardmask layer;
patterning the photoresist layer to expose a first portion of the hardmask layer;
performing a first etch process to remove the first portion of the hardmask layer and expose a second portion of the MR structural layer;
removing a remaining portion of the photoresist layer following the first etch process; and
following removing the remaining portion of the photoresist layer, performing an ion beam etch process using an inert gas to remove the second portion of the MR structural layer and produce a MR sensor structure, wherein following the ion beam etch process, a composite structure remains that includes the MR sensor structure and a hardmask section of the hardmask layer, the hardmask section overlying the MR sensor structures;
depositing a contact layer over the composite structure; and
structuring the contact layer to form an electrically conductive contact at a contact area of the composite structure, the electrically conductive contact being configured for connection to another MR sensor structure, and the hardmask section being interposed between the electrically conductive contact and the MR sensor structure at the contact area, wherein the structuring operation includes removing the contact layer and the hardmask section from a non-contact area of the composite structure to expose the MR sensor structure at the non-contact area.

11. The method of claim 10 wherein the first etch process is a reactive ion etch process.

12. The method of claim 10 wherein following performing the ion beam etch process, the method further comprises:
depositing a protective layer over the composite structure; and
performing a third etch process to remove the protective layer, wherein in response to the third etch process, a top surface of the composite structure is exposed from the protective layer, and a spacer is formed from a remaining portion of the protective layer, the spacer surrounding sidewalls of the composite structure.

13. The method of claim 12 wherein following performing the third etch process, the method further comprises:
depositing a contact layer over the composite structure, wherein the spacer surrounding the sidewalls of the composite structure provides a physical separation between the MR sensor structure and the contact layer;
structuring the contact layer to form an electrically conductive contact at a contact area of the composite structure, the electrically conductive contact being configured for connection to another MR sensor structure, and the hardmask section being interposed between the electrically conductive contact and the MR sensor structure at the contact area, wherein the structuring operation includes removing the contact layer and the hardmask section from a non-contact area of the composite structure to expose the MR sensor structure at the non-contact area.

* * * * *